(12) United States Patent
Noh et al.

(10) Patent No.: US 11,456,316 B2
(45) Date of Patent: Sep. 27, 2022

(54) SEMICONDUCTOR DEVICE HAVING WORD LINE SEPARATION LAYER

(71) Applicant: SAMSUNG ELECTRONICS CO., LTD., Suwon-si (KR)

(72) Inventors: Jiye Noh, Incheon (KR); Jinsoo Lim, Yongin-si (KR); Daehyun Jang, Hwaseong-si (KR); Jisung Cheon, Ansan-si (KR); Sangjun Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/926,045

(22) Filed: Jul. 10, 2020

(65) Prior Publication Data

US 2021/0193678 A1    Jun. 24, 2021

(30) Foreign Application Priority Data

Dec. 23, 2019  (KR) .......................... 10-2019-0173236

(51) Int. Cl.
  *H01L 27/11582*  (2017.01)
  *H01L 23/48*     (2006.01)
  (Continued)

(52) U.S. Cl.
  CPC ...... *H01L 27/11582* (2013.01); *H01L 23/481* (2013.01); *H01L 23/528* (2013.01); *H01L 27/11565* (2013.01); *H01L 27/11573* (2013.01)

(58) Field of Classification Search
  CPC ............. H01L 27/11582; H01L 23/481; H01L 23/528; H01L 27/11565; H01L 27/11573;
  (Continued)

(56) References Cited

U.S. PATENT DOCUMENTS 9,589,981 B2   3/2017  Nishikawa et al.
9,806,093 B2  10/2017  Toyama et al.
              (Continued)

FOREIGN PATENT DOCUMENTS

KR    20170028345    3/2017

OTHER PUBLICATIONS

Office Action dated May 23, 2022 in corresponding Application No. DE 102020121217.8.

*Primary Examiner* — Herve-Louis Y Assouman
(74) *Attorney, Agent, or Firm* — F. Chau & Associates, LLC

(57) ABSTRACT

A semiconductor device includes a peripheral circuit structure disposed on a substrate; a lower stack disposed on the peripheral circuit structure and an upper stack disposed in the lower stack, the lower stack including a plurality of lower insulating layers and a plurality of lower word lines alternately stacked with the lower insulating layers; a plurality of channel structures extending through the lower stack and the upper stack in the cell array area; a pair of separation insulating layers extending vertically through the lower stack and the upper stack and extending in a horizontal direction, the pair of separation insulating layers being spaced apart from each other in a vertical direction; and a word line separation layer disposed at an upper portion of the lower stack and crossing the pair of separation insulating layers when viewed in a plan view, the word line separation layer extending vertically through at least one of the lower word lines.

20 Claims, 32 Drawing Sheets

(51) Int. Cl.
    *H01L 23/528*     (2006.01)
    *H01L 27/11573*     (2017.01)
    *H01L 27/11519*     (2017.01)
    *H01L 27/11565*     (2017.01)

(58) Field of Classification Search
    CPC ......... H01L 27/11519; H01L 27/11546; H01L 27/11563; H01L 21/76229; H01L 27/11524; H01L 27/11529
    USPC .......................................................... 257/213
    See application file for complete search history.

(56) References Cited

U.S. PATENT DOCUMENTS

| | | |
|---|---|---|
| 10,224,104 B2 | 3/2019 | Chowdhury et al. |
| 10,256,248 B2 | 4/2019 | Lu et al. |
| 2010/0109072 A1 | 5/2010 | Kidoh et al. |
| 2017/0179026 A1* | 6/2017 | Toyama ............ H01L 21/76802 |
| 2018/0130816 A1 | 5/2018 | Son et al. |
| 2019/0035798 A1 | 1/2019 | Hwang et al. |
| 2019/0081053 A1 | 3/2019 | Nojima et al. |
| 2019/0214404 A1 | 7/2019 | Ahn et al. |
| 2019/0237475 A1 | 8/2019 | Jung et al. |
| 2019/0237476 A1* | 8/2019 | Lee ..................... H01L 23/5226 |
| 2019/0312051 A1* | 10/2019 | Park .................. H01L 27/11565 |

* cited by examiner

SEMICONDUCTOR DEVICE HAVING WORD LINE SEPARATION LAYER

CROSS-REFERENCE TO RELATED APPLICATION

This U.S. non-provisional patent application claims priority under 35 U.S.C. § 119 to Korean Patent Application No. 10-2019-0173236, filed on Dec. 23, 2019, the disclosure of which is incorporated by reference in its entirety herein.

BACKGROUND

1. Technical Field

The present inventive concept relates to semiconductor devices, and more particularly to semiconductor memory devices having a multi-stack structure.

2. Description of Related Art

A 3-dimensional nonvolatile memory device having a multi-stack structure may be thinner, lighter, smaller, less complex, and more highly integrated than conventional memory devices. Such a nonvolatile memory device includes at least an upper stack, a lower stack and word lines. However, the word line of the lower stack may become unintentionally connected to the word line of the upper stack (e.g., referred to as word line bridging) due to misalignment of channel holes at a boundary between the lower stack and an upper stack during manufacturing. Such word line bridging may cause malfunctions such as data to be written to the wrong region of the memory device.

SUMMARY

At least one embodiment of the inventive concept provides a semiconductor device including a word line separation layer extending vertically through at least one lower word line.

According to an exemplary embodiment of the inventive concept, a semiconductor device includes a substrate including a cell array area and a connecting area, the connecting area including a through-silicon-via (TSV) area; a peripheral circuit structure disposed on the substrate; a lower stack disposed on the peripheral circuit structure and an upper stack disposed on the lower stack, the lower stack including a plurality of lower insulating layers and a plurality of lower word lines alternately stacked with the lower insulating layers; a plurality of channel structures extending through the lower stack and the upper stack in the cell array area; a plurality of dummy channel structures extending through the lower stack and the upper stack in the connecting area; a pair of separation insulating layers extending vertically through the lower stack and the upper stack and extending in a first direction, the pair of separation insulating layers being spaced apart from each other in a second direction crossing the first direction; and a word line separation layer disposed at an upper portion of the lower stack and crossing the pair of separation insulating layers when viewed in a plan view, the word line separation layer extending vertically through at least one of the lower word lines.

According to an exemplary embodiment of the inventive concept, a semiconductor device a substrate including a cell array area and first and second connecting areas disposed at opposite sides of the cell array area, each of the first and second connecting areas including a plurality of through-silicon-via (TSV) areas; a peripheral circuit structure disposed on the substrate; a lower stack disposed on the peripheral circuit structure and an upper stack disposed on the lower stack, the lower stack including a plurality of lower insulating layers and a plurality of lower word lines alternately stacked with the lower insulating layers; a plurality of channel structures extending through the lower stack and the upper stack in the cell array area; a plurality of dummy channel structures extending through the lower stack and the upper stack in the connecting areas; a plurality of separation insulating layers extending vertically through the lower stack and the upper stack and extending in a first direction, the separation insulating layers being spaced apart from one another in a second direction crossing the first direction; and a plurality of word line separation layers disposed at an upper portion of the lower stack and crossing two adjacent separation insulating layers among the plurality of separation insulating layers, the plurality of word line separation layers extending vertically through at least one of the lower word lines. The plurality of word line separation layers are arranged in the second direction in a zigzag manner within the first connecting area and the second connecting area, and each of the word line separation layers is disposed between the cell array area and the plurality of TSV areas.

According to an exemplary embodiment of the inventive concept, a semiconductor device may comprise a substrate including a cell array area and a connecting area, the connecting area including a through-silicon-via (TSV) area; a peripheral circuit structure disposed on the substrate; a lower conductive layer disposed on the peripheral circuit structure; a connecting conductive layer disposed on the lower conductive layer in the cell array area; a connecting mold layer disposed on the lower conductive layer in the connecting area; a supporter disposed on the connecting conductive layer and the connecting mold layer; a buried insulating layer disposed in the TSV area and extending through the lower conductive layer, the connecting mold layer and the supporter; a lower stack disposed on the supporter, the lower stack including a plurality of lower insulating layers and a plurality of lower word lines alternately stacked with the lower insulating layers; an upper stack disposed on the lower stack, the upper stack including a plurality of upper insulating layers and a plurality of upper word lines alternately stacked with the upper insulating layers; a plurality of channel structures extending through the lower stack and the upper stack in the cell array area; a plurality of dummy channel structures extending through the lower stack and the upper stack in the connecting area; a pair of separation insulating layers extending vertically through the lower stack and the upper stack and extending in a first direction, the pair of separation insulating layers being spaced apart from each other in a second direction crossing the first direction; a word line separation layer disposed at an upper portion of the lower stack and crossing the pair of separation insulating layers, the word line separation layer extending vertically through at least one of the lower word lines; and a TSV disposed in the TSV area, the TSV extending through the upper stack and the lower stack and connected to the peripheral circuit structure.

According to an exemplary embodiment of the inventive concept, a method for manufacturing a semiconductor device include forming a substrate including a cell array area and a connecting area, the connecting area including a through-silicon-via (TSV) area; forming a peripheral circuit structure on the substrate; forming, on the peripheral circuit structure, a lower stack including a plurality of lower insulating layers and a plurality of lower sacrificial layers alternately stacked with the lower insulating layers; forming, at an upper portion of the lower stack, a word line separation layer extending vertically through at least one of the lower sacrificial layers between the cell array area and the TSV area; forming, on the lower stack, an upper stack including a plurality of upper insulating layers and a plurality of upper sacrificial layers alternately stacked with the upper insulating layers; forming a channel structure extending through the lower stack and the upper stack in the cell array area; forming a dummy channel structure extending through the lower stack and the upper stack in the connecting area; forming a plurality of separation insulating layers extending vertically through the lower stack and the upper stack and extending in a horizontal direction and crossing the word line separation layer; removing the plurality of lower sacrificial layers and the plurality of upper sacrificial layers, forming a plurality of lower word lines between the lower insulating layers; and forming a plurality of upper word lines between the upper insulating layers.

BRIEF DESCRIPTION OF THE DRAWINGS

The inventive concept will become more apparent to those of ordinary skill in the art due to the below descriptions of exemplary embodiments thereof with reference to the accompanying drawings, in which.

DETAILED DESCRIPTION OF EXEMPLARY EMBODIMENTS

Figure 1:
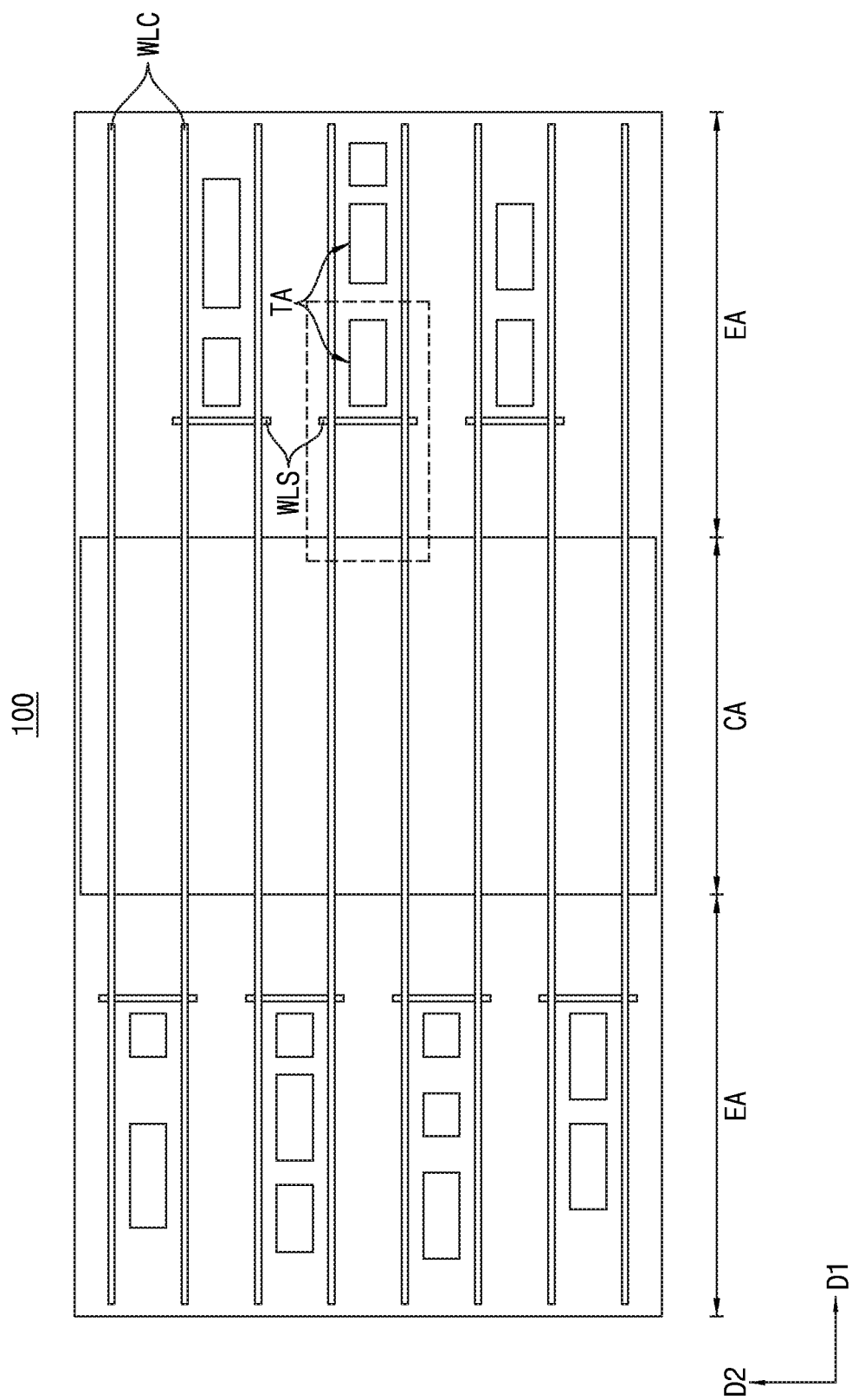
FIG. 1 is a layout of a semiconductor device according to an exemplary embodiment of inventive concept.
Figure 2:
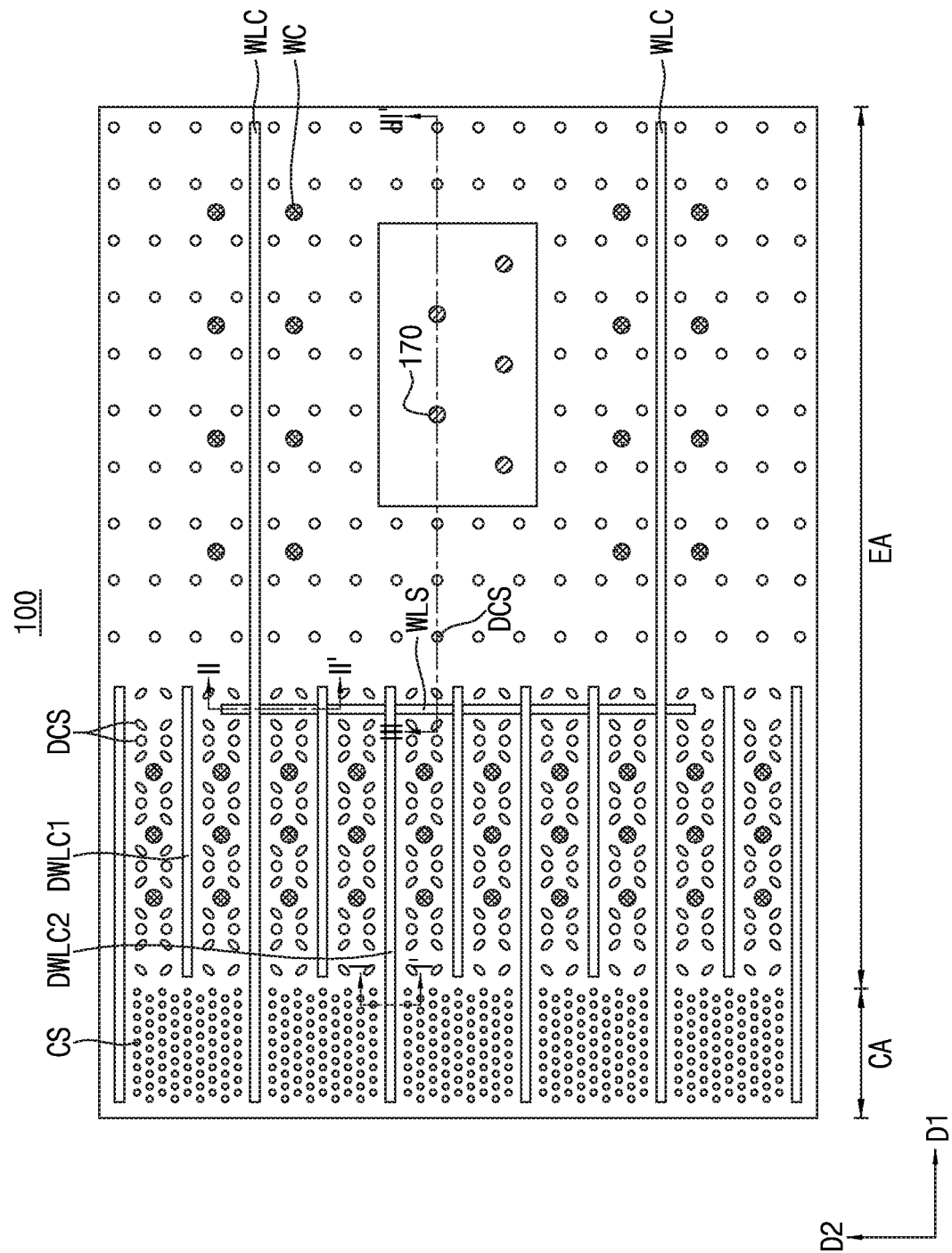
FIG. 2 is an enlarged view of the semiconductor device shown in FIG. 1.
Figure 3A:
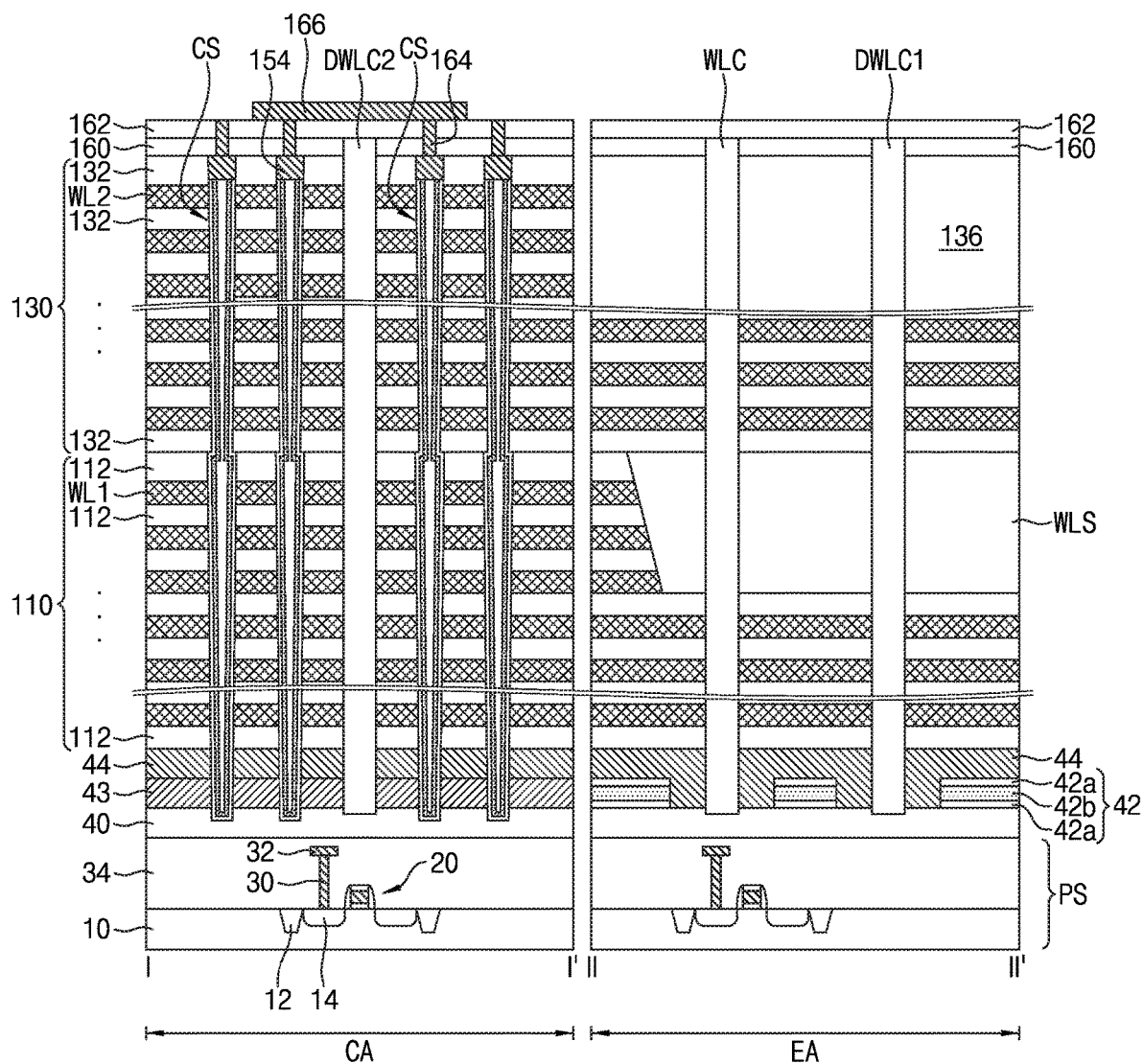
FIGS. 3A-3B are vertical cross-sectional views of the semiconductor shown in FIG. 2, taken along lines I-I', II-II', and III-III'.
Figure 3B:
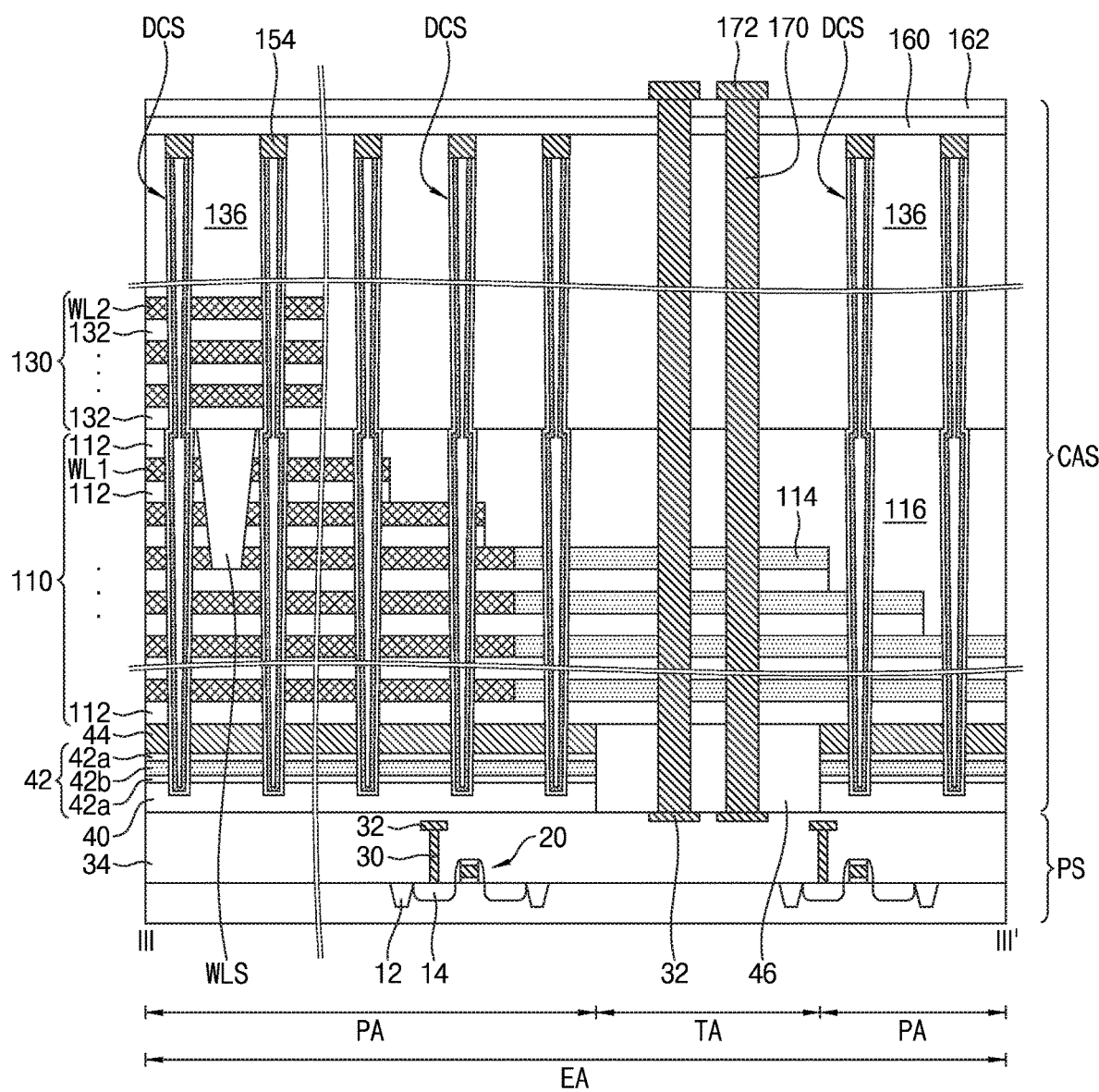

FIG. 1 is a layout of a semiconductor device according to an exemplary embodiment of inventive concepts. FIG. 2 is an enlarged view of the semiconductor device shown in FIG. 1. FIGS. 3A-3B are vertical cross-sectional views of the semiconductor shown in FIG. 2, taken along lines I-I', II-II', and III-III'. The semiconductor device according to an exemplary embodiment of the present inventive concept, that is, a semiconductor device 100, may include a flash memory such as a 3D-NAND.

Referring to FIG. 1, the semiconductor device 100 according to an exemplary embodiment of the present inventive concept includes a cell array area CA (e.g., a plurality of memory cells), and connecting areas EA disposed at opposite sides of the cell array area CA. Each connecting area EA may include through-silicon-via (TSV) areas TA. The TSV areas TA of the connecting areas EA may be arranged in a zigzag manner within the connecting areas EA at opposite sides of the cell array area CA. In an exemplary embodiment, the TSV areas TA arranged in a zigzag manner includes a plurality of TSV areas TA or TSVs arranged into a first row and another plurality of TSV areas or TSVs arranged into a second row that is offset from the first row. In an exemplary embodiment of the inventive concept, the semiconductor device 100 includes separation insulating layers WLC and word line separation layers WLS. The separation insulating layers WLC may extend in a first direction D1 throughout the cell array area CA and the connecting areas EA. The word line separation layer WLS may have a bar or segment extending in a second direction D2 when viewed in a plan view. The word line separation layer WLS may have a dam shape when viewed in a side view or a sectional view. In an exemplary embodiment of the inventive concept, the word line separation layer WLS is formed to cross two adjacent separation insulating layers WLC. The word line separation layer WLS may be disposed between the cell array area CA and the TSV areas TA, for example, the word line separation layer WLS may be disposed between the cell array area CA and the TSV area disposed nearest to the cell array area CA among the TSV areas TA disposed between two adjacent separation insulating layers WLC. In an exemplary embodiment of the inventive concept, the word line separation layers WLS are arranged into a single column within a connecting area EA. In an alternate embodiment, the word line separation layers WLS are arranged into multiple columns in a connecting area EA that are offset from one another in the second direction D2 in a zigzag manner.

Referring to FIGS. 2, 3A, and 3B, the cell array area CA may include a plurality of channel structures CS. The connecting area EA may include a plurality of dummy channel structures DCS. The connecting area EA may include pad areas PA including a plurality word line contacts WC, and TSV areas TA.

The semiconductor device 100 of the present disclosure may have a cell over peripheral (COP) structure. For example, the semiconductor device 100 may include a peripheral circuit structure PS, and a cell array structure CAS disposed on the peripheral circuit structure PS. In an exemplary embodiment of the inventive concept, the peripheral circuit structure PS includes a substrate 10, device isolation layers 12, impurity regions 14, transistors 20, contact plugs 30, peripheral circuit lines 32, and a peripheral insulating layer 34.

The substrate 10 may include the device isolation layers 12 and the impurity regions 14. The transistors 20, the contact plugs 30, and the peripheral circuit lines 32 may be disposed on the substrate 10. The substrate 10 may include a semiconductor material. In an exemplary embodiment, the substrate 10 is entirely the semiconductor material. For example, the substrate 10 may be a silicon substrate, a germanium substrate, a silicon germanium substrate, or a silicon-on-insulator (SOI) substrate. In an example embodiment, the substrate 10 may include IV-group semiconductor, III-V-group compound semiconductor or II-VI-group oxide semiconductor.

The impurity region 14 may be disposed adjacent to a corresponding one of the transistors 20. In an exemplary embodiment, an impurity region 14 contacts one of the transistors 20. The peripheral insulating layer 34 may cover the transistors 20 and the contact plugs 30. The contact plug 30 may be electrically connected to a corresponding one of the impurity regions 14. The peripheral circuit line 32 may be connected to a corresponding one of the contact plugs 30.

The cell array structure CAS may be disposed on the peripheral insulating layer 34. In an exemplary embodiment, the cell array structure CAS includes a lower stack 110, a lower interlayer insulating layer 116, word line separation layers WLS, an upper stack 130, an upper interlayer insulating layer 136, channel structures CS, dummy channel structures DCS, separation insulating layers WLC, dummy separation insulating layers DWLC1 and DWLC2, and through-silicon-vias (TSVs) 170. The cell array structure CAS may further include a lower conductive layer 40, a connecting mold layer 42, a connecting conductive layer 43, a supporter 44, and a buried insulating layer 46, which are disposed beneath the lower stack 110.

The lower conductive layer 40 may be disposed on the peripheral circuit structure PS. The lower conductive layer 40 may correspond to a common source line CSL. In an exemplary embodiment, the lower conductive layer 40 includes doped polysilicon. In an exemplary embodiment, the connecting mold layer 42 is partially disposed on the lower conductive layer 40 within the connecting area EA. In an exemplary embodiment, the connecting mold layer 42 is disposed in the pad areas PA, but not in the TSV areas TA. In an exemplary embodiment, the connecting mold layer 42 includes a sacrificial layer 42b, and passive layers 42a disposed at upper and lower surfaces of the sacrificial layer 42b. For example, the sacrificial layer 42b may be disposed between a pair of passive layers 42a. The connecting conductive layer 43 may be disposed on the lower conductive layer 40 within the cell array area CA. The supporter 44 may be disposed on both the connecting mold layer 42 and the connecting conductive layer 43. In an exemplary embodiment of the inventive concept, the supporter 44 contacts an upper surface of the lower conductive layer 40 around the separation insulating layer WLC. The buried insulating layer 46 may be disposed on the lower conductive layer 40 within the TSV area TA. In an exemplary embodiment, the upper surface of the buried insulating layer 46 is disposed at the same level as the upper surface of the supporter 44. In an exemplary embodiment, the buried insulating layer 46 contacts a first surface of the lower conductive layer 40 and contacts a second surface of the lower conductive layer 40 that opposes the first surface.

The lower stack 110 may include a plurality of lower insulating layers 112 and a plurality of lower word lines WL1 which are alternately stacked. At least one of the lower word lines WL1 disposed at a lower portion of the lower stack 110 may be a ground selection line GSL. The lower stack 110 may have a stepped structure within the connecting area EA. The lower stack 110 may include a plurality of lower sacrificial layers 114 alternately stacked with the plurality of lower insulating layers 112 around the TSV area TA. In an exemplary embodiment, each lower sacrificial layer 114 is disposed at the same level as the lower word line WL1 corresponding thereto. In an exemplary embodiment, the lower insulating layer 112 includes silicon oxide. In an exemplary embodiment, the lower insulating layer 112 is entirely silicon oxide. The lower interlayer insulating layer 116 may cover the stepped structures of the lower stack 110.

In an exemplary embodiment, the upper stack 130 includes a plurality of upper insulating layers 132 and a plurality of upper word lines WL2 which are alternately stacked. At least one of the upper word lines WL2 disposed at an upper portion of the upper stack 130 may be a string selection line SSL or a drain selection line DSL. The upper stack 130 may have a stepped structure within the connecting area EA. The upper insulating layer 132 may include the same material as the lower insulating layer 112. The upper interlayer insulating layer 136 may cover the stepped structures of the upper stack 130.

In an exemplary embodiment of the inventive concept, the channel structures CS extend vertically through the connecting conductive layer 43, the supporter 44, the lower stack 110, and the upper stack 130 within the cell array areas CA. The channel structures CS may be electrically connected to the connecting conductive layer 43. In an exemplary embodiment of the inventive concept, the dummy channel structures DCS extend vertically through the connecting mold layer 42, the supporter 44, the lower stack 110, and the upper stack 130 within the connecting areas EA. In addition, the dummy channel structures DCS may extend vertically through the lower interlayer insulating layer 116 and the upper interlayer insulating layer 136. Conductive pads 154 may be disposed on the channel structures CS and the dummy channel structures DCS.

A first upper insulating layer 160 may be disposed on the upper stack 130 and the upper interlayer insulating layer 136. A second upper insulating layer 162 may be disposed on the first upper insulating layer 160. Bit line plugs 164 may be connected to the conductive pads 154 while extending through the first upper insulating layer 160 and the second upper insulating layer 162. Bit lines 166 may be disposed on the second upper insulating layer 162, and may be connected to the bit line plugs 164.

TSVs 170 may be disposed within the TSV areas TA. The TSV 170 may extend vertically through the buried insulating layer 46, the lower stack 110, the lower interlayer insulating layer 116, and the upper interlayer insulating layer 136. Connecting lines 172 may be disposed on the TSVs 170. In an exemplary embodiment, the TSV 170 electrically connects the connecting lines 172 to the peripheral circuit lines 32 in the peripheral circuit structure PS.

In an exemplary embodiment of the inventive concept, the separation insulating layers WLC and the dummy separation insulating layers DWLC1 and DWLC2 contact the lower conductive layer 40 while extending vertically through the supporter 44, the lower stack 110, the upper stack 130, the upper interlayer insulating layer 136, and the first upper insulating layer 132. Although not shown, the separation insulating layers WLC and the dummy separation insulating layers DWLC1 and DWLC2 may extend through the lower interlayer insulating layer 116. The dummy separation insulating layers DWLC1 and DWLC2 may be disposed between the separation insulating layers WLC. In an exemplary embodiment of the inventive concept, the dummy separation insulating layers DWLC1 and DWLC2 extend in the first direction D1 while being arranged in an alternating manner. The dummy separation insulating layer DWLC1 may be disposed in the connecting areas EA, whereas the dummy separation insulating layer DWLC2 may be disposed in an area extending from the cell array area CA to the connecting areas EA. The dummy separation insulating layer DWLC2 may be disposed in the cell array area CA.

In an exemplary embodiment, the word line separation layer WLS is disposed at an upper portion of the lower stack 110 between the cell array area CA and the TSV area TA. The word line separation layer WLS may extend downwards from an upper surface of the lower stack 110 while extending vertically through the lower word lines WL1. In the lower word lines WL1 separated by the corresponding word line separation layer WLS, portions thereof disposed in the cell array area CA may be electrically insulated from portions thereof disposed in the TSV areas TA. Alternatively, portions of the lower word lines WL1 separated by the word line separation layer WLS may be electrically insulated from the channel structures CS. In an exemplary embodiment of the inventive concept, the word line separation layer WLS extends from an upper end of the lower stack 110 through 13 lower word lines WL1 without being limited thereto. In an exemplary embodiment, the word line separation layer WLS extends from an upper end of the lower stack 110 through 13 lower word lines WL1 or less. In an exemplary embodiment, the upper surface of the word line separation layer WLS is disposed at the same level as the upper surface of the lower interlayer insulating layer 116. In an exemplary embodiment, the lower surface of the word line separation layer WLS is disposed at a higher level than the upper surface of the supporter 44.

When viewed in a plan view, the word line separation layer WLS may extend in the second direction D2 while crossing two adjacent separation insulating layers WLC. In addition, in an exemplary embodiment of the inventive concept, the word line separation layer WLS crosses the plurality of dummy separation insulating layers DWLC1 and DWLC2. In an exemplary embodiment of the inventive concept, the word line separation layer WLS does not cross the dummy channel structures DCS. In an exemplary embodiment of the inventive concept, the separation insulating layer WLC completely crosses the word line separation layers WLS. For example, when viewed in a longitudinal sectional view, lateral end portions of the word line separation layer WLS may be disposed outside two adjacent separation insulating layers WLC. In an exemplary embodiment of the inventive concept, the lateral end portions of the word line separation layer WLS do not cross the dummy separation insulating layers DWLC1 and DWLC2. In addition, when viewed in a sectional view, the word line separation layer WLS may have a tapered shape having a width gradually reduced while extending downwards. In an exemplary embodiment of the inventive concept, a lower end of a cross-section of the word line separation layer WLS in the second direction D2 is disposed outside two adjacent separation insulating layers WLC.

Figure 4:
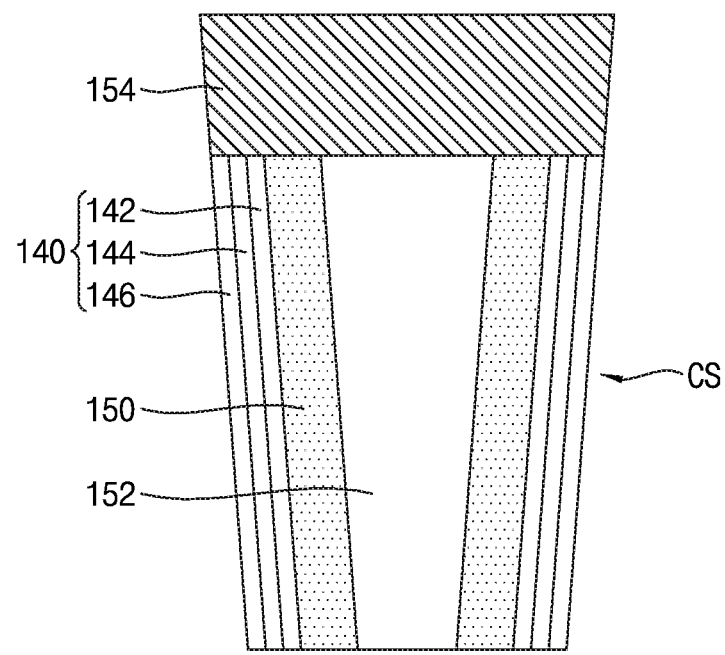
FIGS. 4-5 are enlarged views of the semiconductor shown in FIG. 3A.
Figure 5:
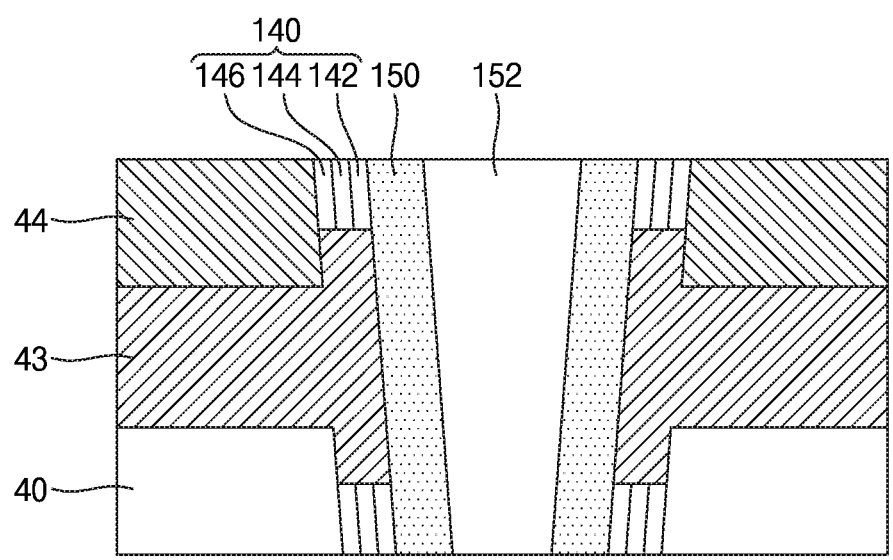

FIGS. 4-5 are enlarged views of the semiconductor shown in FIG. 3A.

Referring to FIG. 4, in an exemplary embodiment of the inventive concept, the channel structure CS includes an information storage layer 140, a channel layer 150, and a buried insulating pattern 152. The channel layer 150 may be disposed inside the information storage layer 140, and the buried insulating pattern 152 may be disposed inside the channel layer 150. In an exemplary embodiment of the inventive concept, the information storage layer 140 includes a blocking layer 142, a charge storage layer 144, and a tunnel insulating layer 146. The charge storage layer 144 may be disposed inside the blocking layer 142, and the tunnel insulating layer 146 may be disposed inside the charge storage layer 144. In an exemplary embodiment of the inventive concept, the channel layer 150 includes polysilicon. In an exemplary embodiment, the channel layer 150 is entirely made from polysilicon. The buried insulating pattern 152 may include silicon oxide, silicon nitride, silicon oxynitride, or a combination thereof. In an exemplary embodiment of the inventive concept, the blocking layer 142 and the tunnel insulating layer 146 include silicon oxide. In an exemplary embodiment, the blocking layer 142 and the tunnel insulating layer are made entirely of silicon oxide. The charge storage layer 144 may include silicon nitride. In an exemplary embodiment of the inventive concept, the charge storage layer 144 is entirely made from silicon nitride. The dummy channel structure DCS may have substantially the same structure as the channel structure CS. For example, the dummy channel structure DCS may include the information storage layer 140, the channel layer 150, and the buried insulating pattern 152.

Referring to FIG. 5, in an exemplary embodiment of the inventive concept, the connecting conductive layer 43 contacts a side surface of the channel layer 150 while extending through the information storage layer 140. A portion of the connecting conductive layer 43 in contact with the channel layer 150 may extend in the vertical direction.

Figure 6:
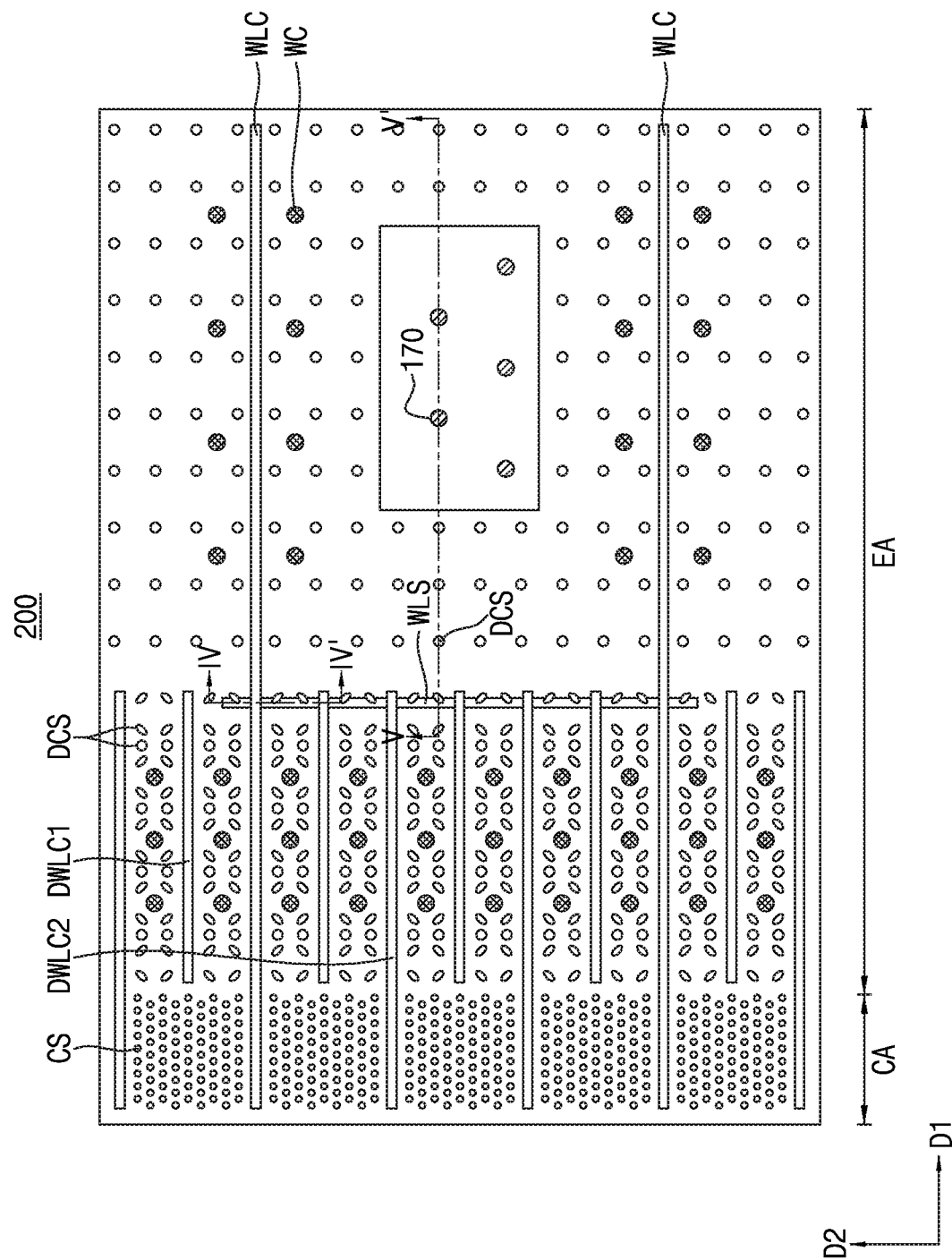
FIG. 6 is a layout of a semiconductor device according to an exemplary embodiment of inventive concept.
Figure 7A:
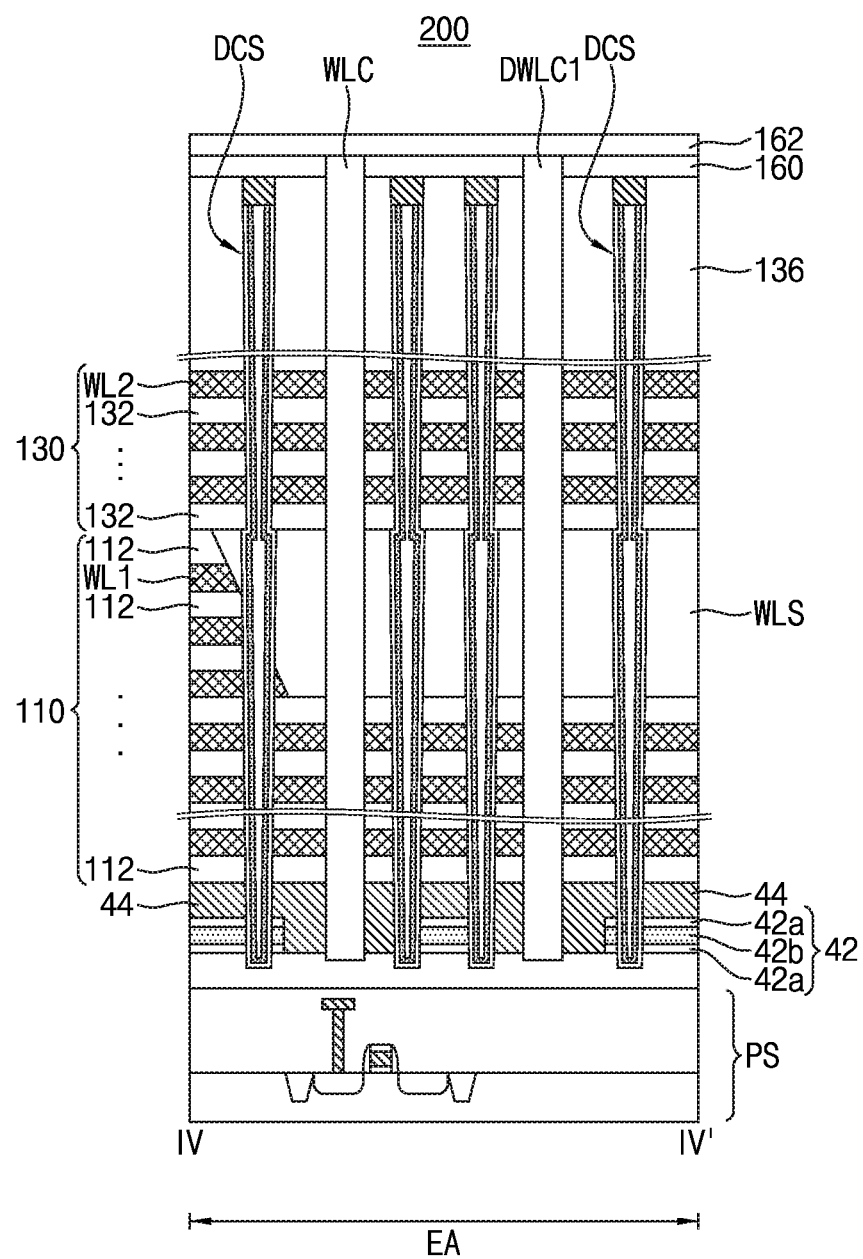
FIGS. 7A-7B are vertical cross-sectional views of the semiconductor shown in FIG. 6, taken along lines IV-IV', and V-V'.
Figure 7B:
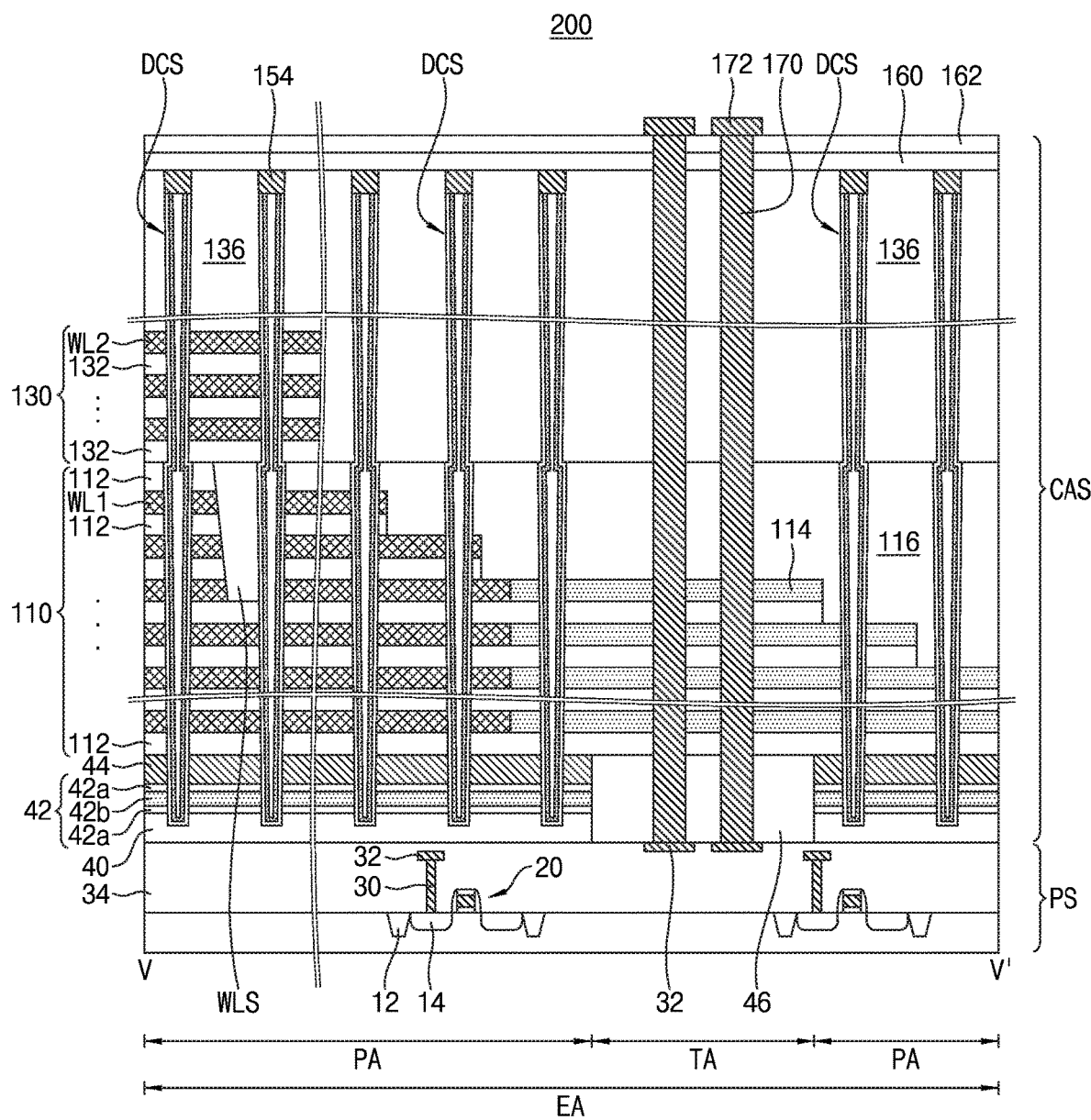

FIG. 6 is a layout of a semiconductor device according to an exemplary embodiment of inventive concept. FIGS. 7A-7B are vertical cross-sectional views of the semiconductor shown in FIG. 6, taken along lines IV-IV', and V-V'.

Referring to FIGS. 6, 7A and 7B, a semiconductor device 200 includes a word line separation layer WLS crossing the separation insulating layers WLC and the dummy separation insulating layers DWLC1 and DWLC2. In an exemplary embodiment, the word line separation layer WLS overlaps with the dummy channel structures DCS. For example, the word line separation layer WLS may overlap with a column or a row of the dummy channel structures DCS. At least one of the dummy channel structures DCS may completely extend through the word line separation layer WLS. In an exemplary embodiment of the inventive concept, at least one of the dummy channel structures DCS partially extends through the word line separation layer WLS.

Figure 8:
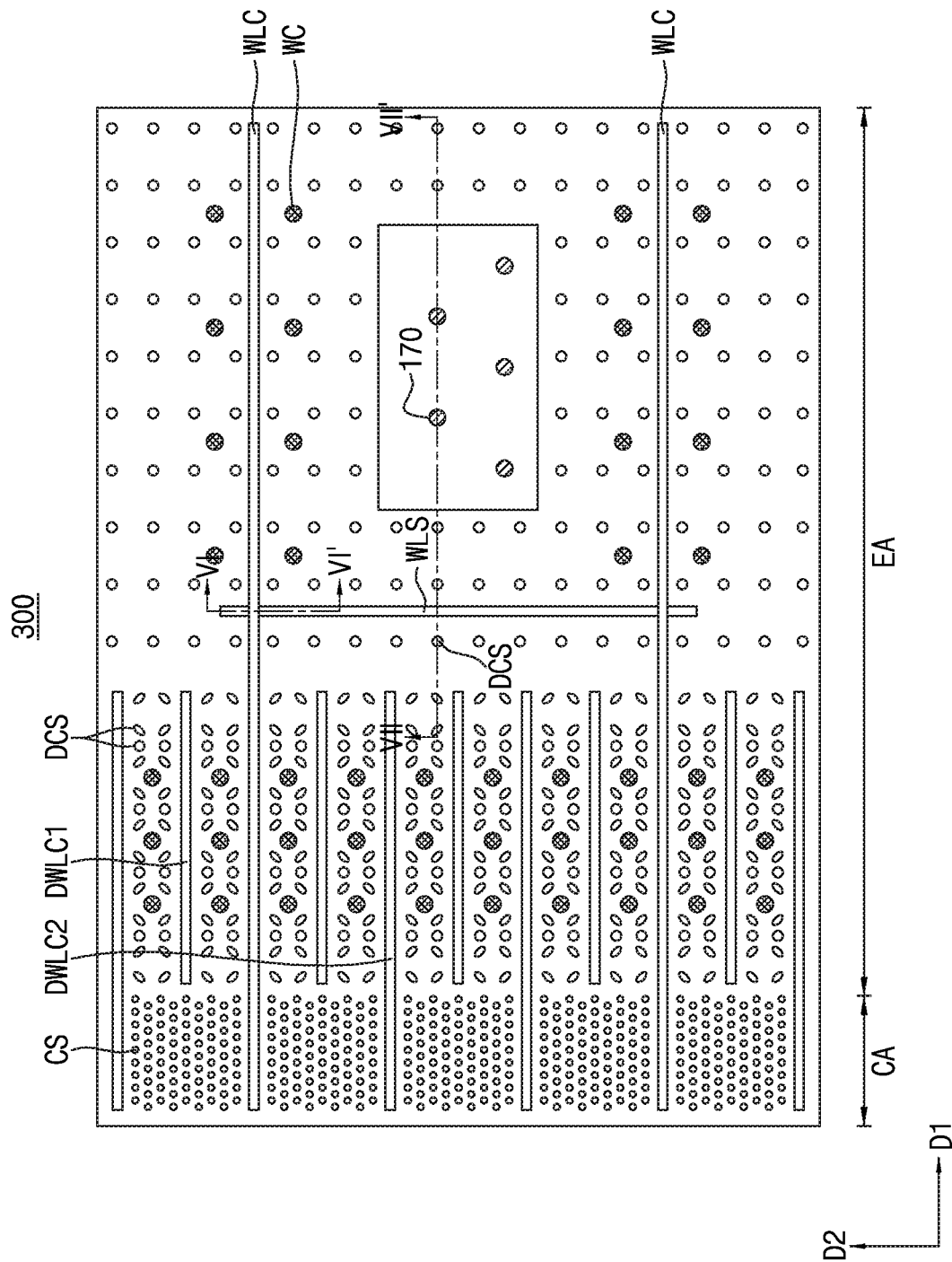
FIG. 8 is a layout of a semiconductor device according to an exemplary embodiment of inventive concept.
Figure 9A:
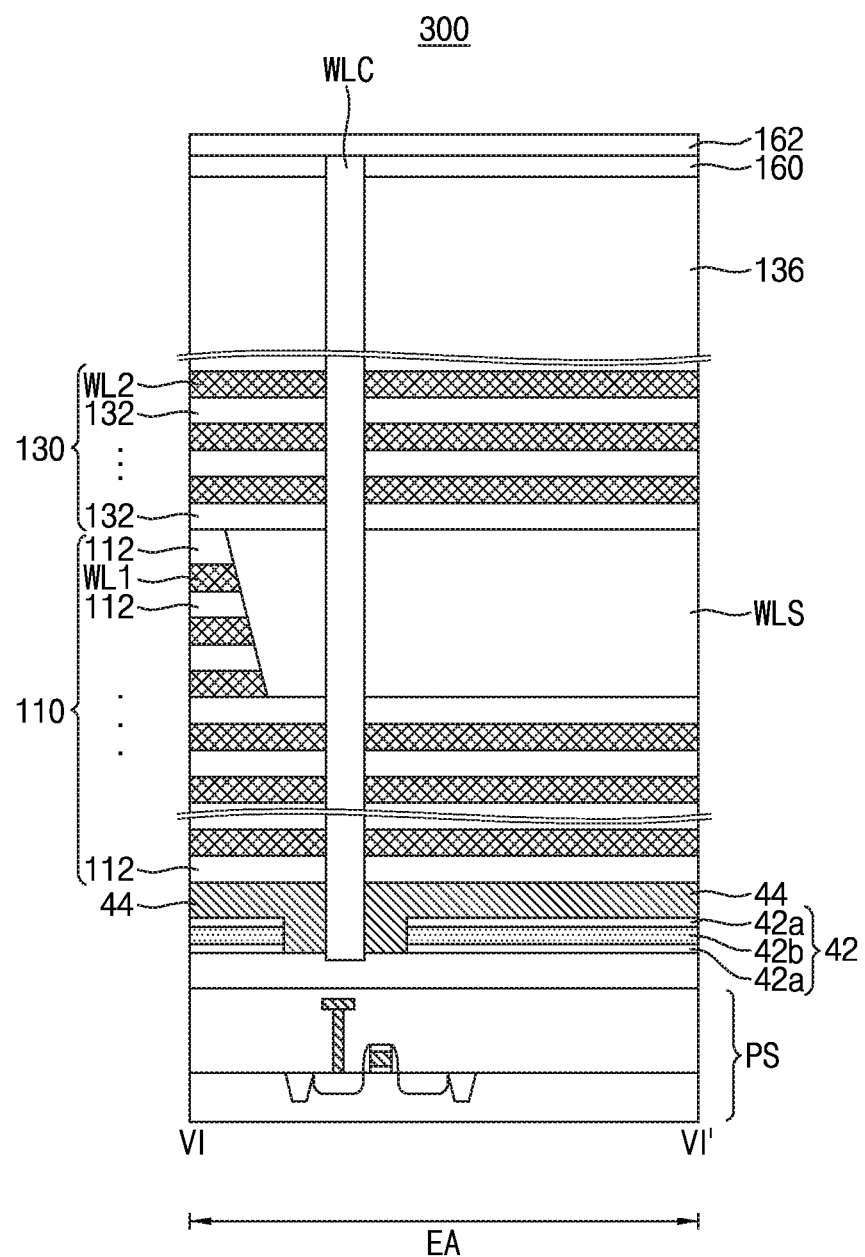
FIGS. 9A-9B are vertical cross-sectional views of the semiconductor shown in FIG. 8, taken along lines VI-VI', and VII-VII'.
Figure 9B:
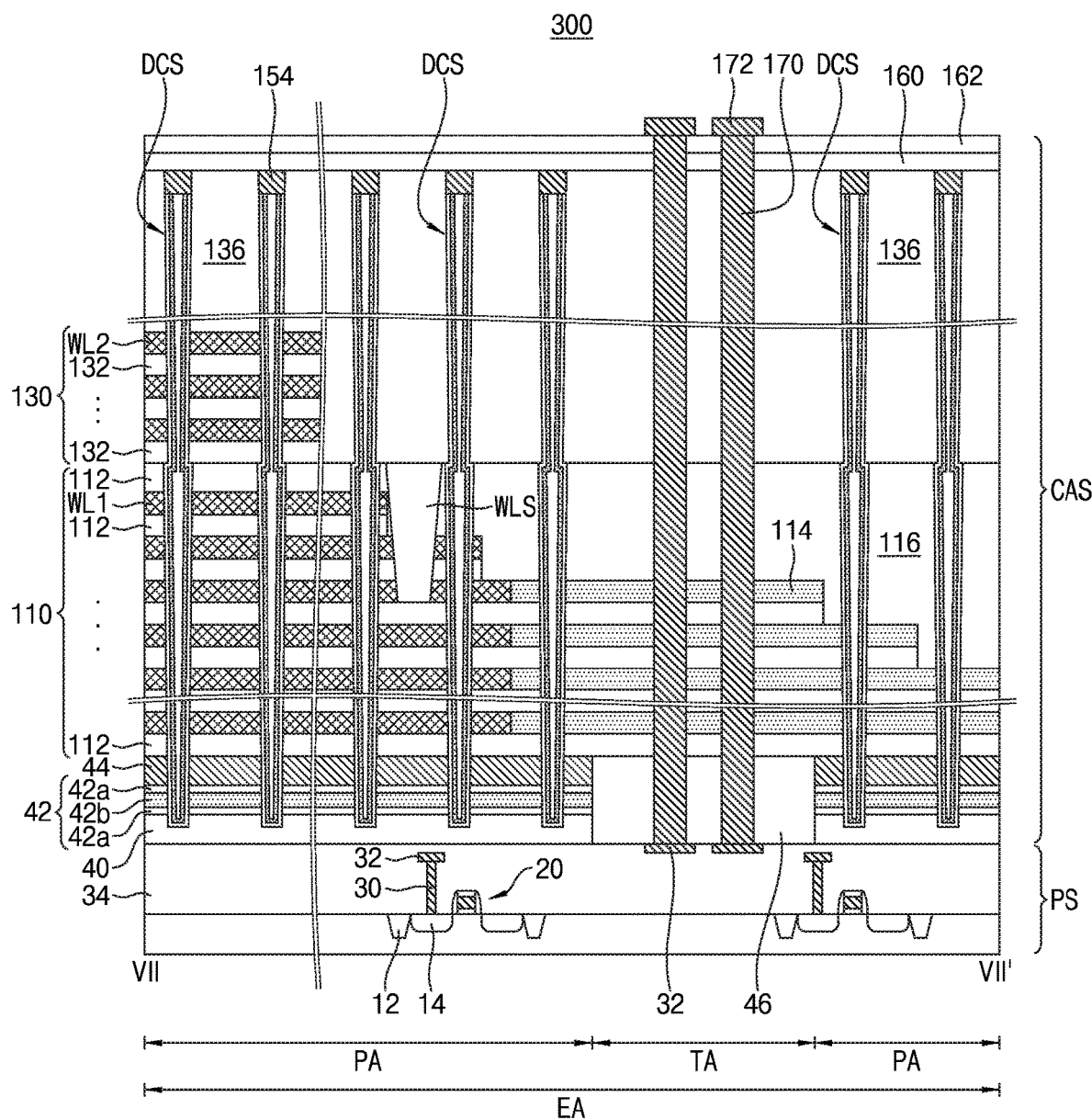

FIG. 8 is a layout of a semiconductor device according to an example embodiment of inventive concepts. FIGS. 9A-9B are vertical cross-sectional views of the semiconductor shown in FIG. 8, taken along lines VI-VI', and VII-VII'.

Referring to FIGS. 8, 9A and 9B, a semiconductor device 300 according to an exemplary embodiment of the inventive concept includes a word line separation layer WLS crossing the separation insulating layers WLC. In an exemplary embodiment of the inventive concept, the word line separation layer WLS does not cross the dummy separation insulating layers DWLC1 and DWLC2. For example, the word line separation layer WLS may be disposed between the dummy separation insulating layers DWLC1 and DWLC2 and the TSV area TA. In an exemplary embodiment of the inventive concept, the word line separation layer WLS partially extends through a stepped structure of the lower stack 110.

Figure 10:
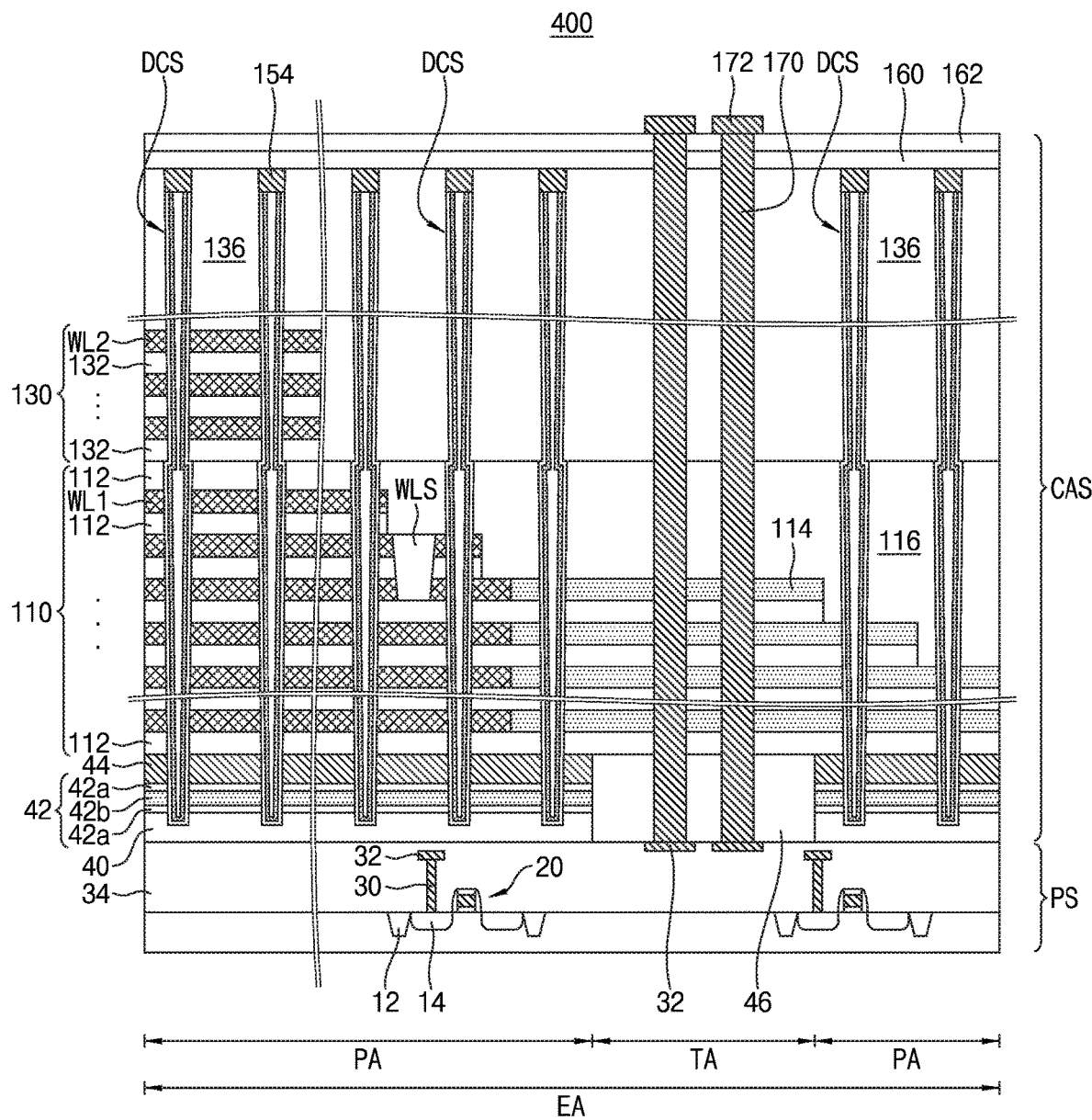
FIGS. 10-11 are vertical cross-sectional views of a semiconductor device according to an exemplary embodiment of inventive concept.
Figure 11:
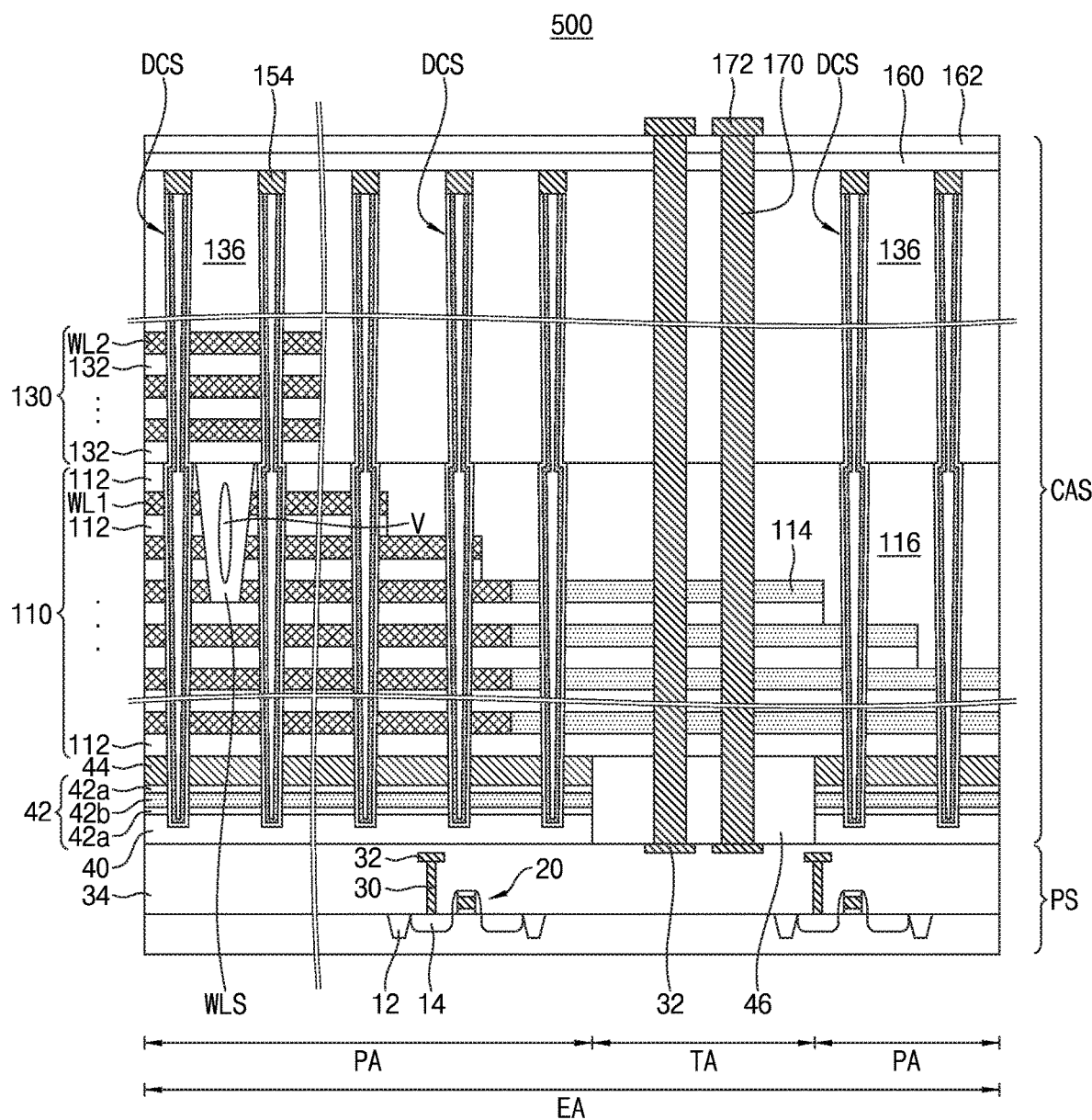

FIGS. 10-11 are vertical cross-sectional views of a semiconductor device according to an exemplary embodiment of inventive concept.

Referring to FIG. 10, a semiconductor device 400 includes a word line separation layer WLS extending vertically through the lower word lines WL1. In an exemplary embodiment of the inventive concept, the word line separation layer WLS extends through a portion of a stepped structure of the lower stack 110. For example, the word line separation layer WLS may extend through a portion including a lower word line WL1 and an insulating layer 112. In an exemplary embodiment of the inventive concept, the upper surface of the word line separation layer WLS is disposed at a lower level than the upper surface of the lower interlayer insulating layer 116. For example, the upper surface of the word line separation layer WLS may be disposed at the same level as the upper surface of a corresponding one of the lower word lines WL1. In an exemplary embodiment of the inventive concept, the upper surface of the word line separation layer WLS is disposed at the same level as the lower surface of a corresponding one of the lower insulating layers 112.

Referring to FIG. 11, a semiconductor device 500 according to an exemplary embodiment of the inventive concept includes a word line separation layer WLS extending vertically through the lower word lines WL1. In an exemplary embodiment, the word line separation layer WLS include a void V disposed at an inner portion of the word line separation layer WLS. In an exemplary embodiment, the void V is a pocket or hole that include air or some other gas.

Figure 12:
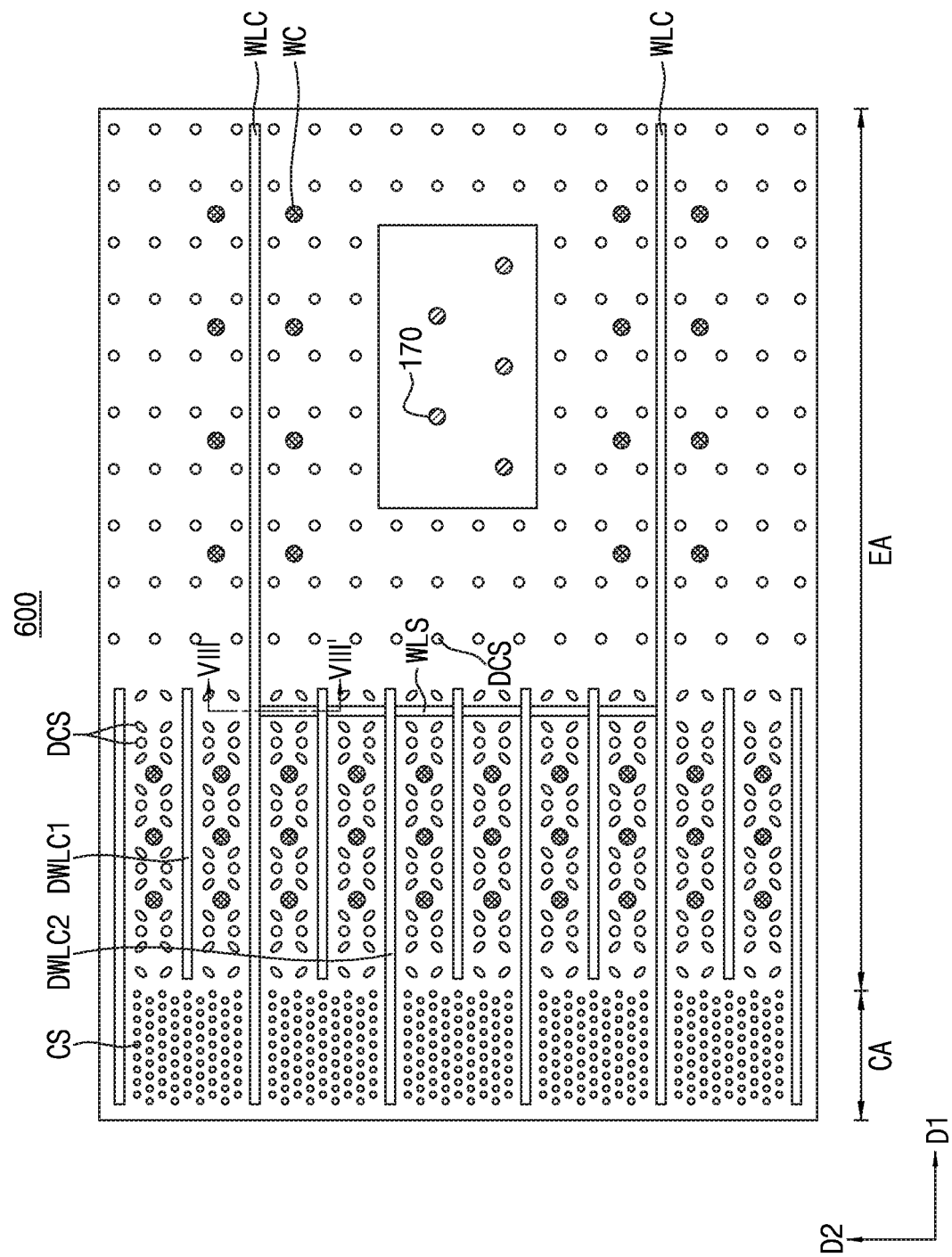
FIG. 12 is a layout of a semiconductor device according to an exemplary embodiment of inventive concept.
Figure 13:
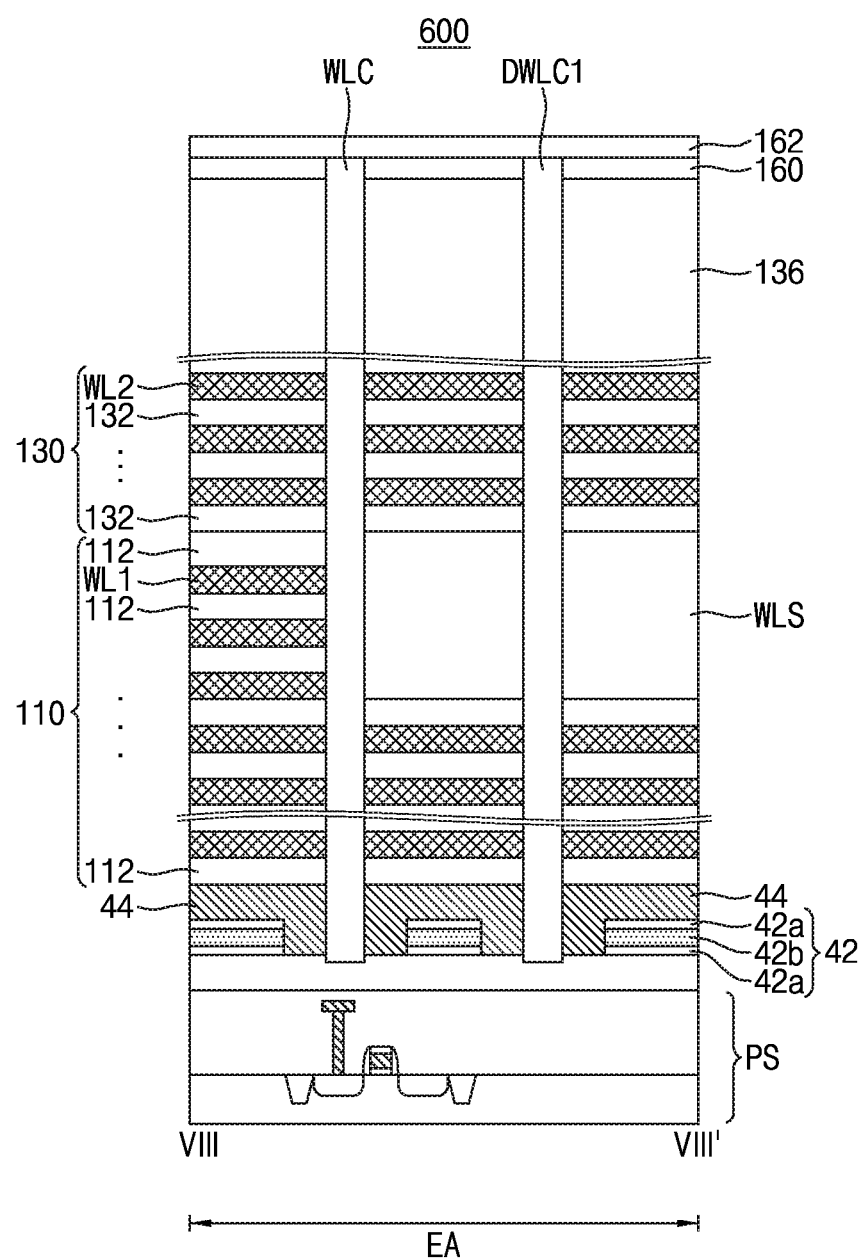
FIG. 13 is a vertical cross-sectional views of the semiconductor shown in FIG. 12, taken along lines VIII-VIII'.

FIG. 12 is a layout of a semiconductor device according to an exemplary embodiment of inventive concept. FIG. 13 is a vertical cross-sectional views of the semiconductor shown in FIG. 12, taken along lines VIII-VIII'.

Referring to FIGS. 12 and 13, a semiconductor device 600 according to an exemplary embodiment of the inventive concept includes a word line separation layer WLS crossing the dummy separation insulating layers DWLC1 and DWLC2. In an exemplary embodiment of the inventive concept, the word line separation layer WLS contacts side surfaces of the separation insulating layer WLC. For example, the cross-section of the word line separation layer WLS in the second direction D2 may contact the side surfaces of the separation insulating layer WLC.

FIG. 14A-24B are vertical cross-sectional views illustrating a method of manufacturing a semiconductor device according to an exemplary embodiment of inventive concept. FIGS. 14A, 15A, 16A, 17A, 18A, 19A, 20A, 21A, 22A, 23A, and 24A are cross-sectional views taken along lines I-I' and II-II' in the semiconductor device shown in FIG. 2. FIGS. 14B, 15B, 16B, 17B, 18B, 19B, 20B, 21B, 22B, 23B, and 24B are cross-sectional views taken along line III-III' in the semiconductor device shown in FIG. 2.

Figure 14A:
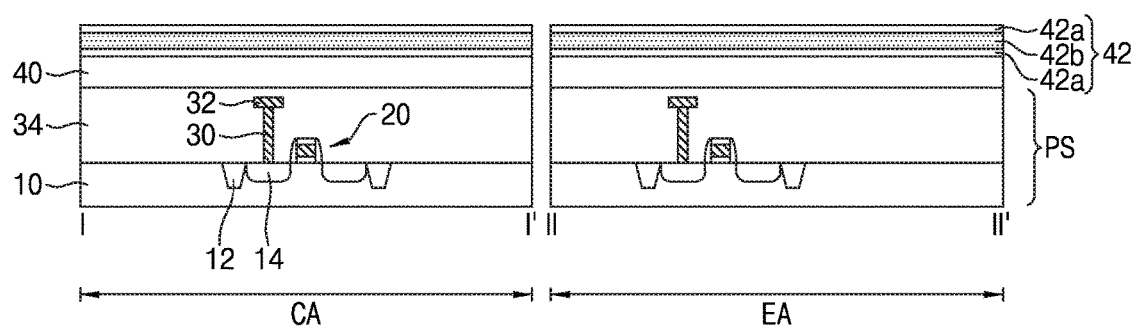
FIG. 14A-24B are vertical cross-sectional views illustrating a method of manufacturing a semiconductor device according to an exemplary embodiment of inventive concept.
Figure 14B:
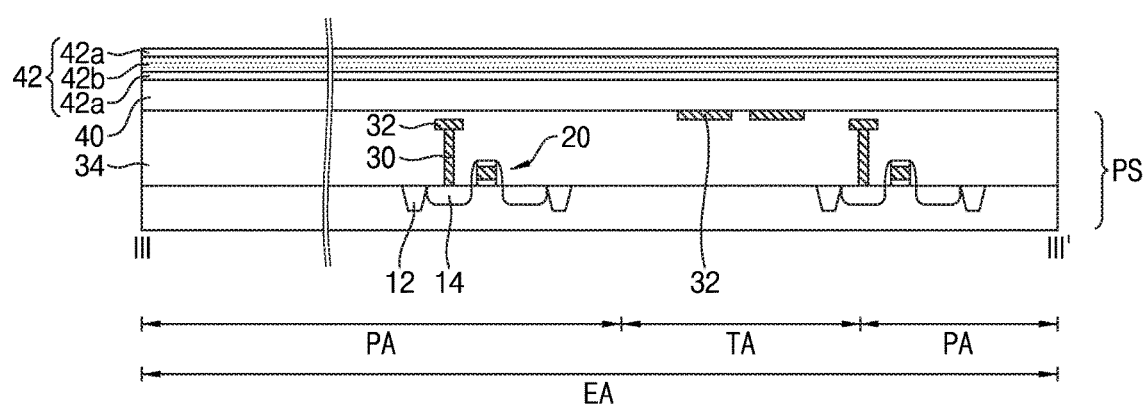

Referring to FIGS. 14A and 14B, the method for manufacturing a semiconductor device 100 include forming the peripheral circuit structure PS, forming a lower conductive layer 40 on the peripheral circuit structure PS, and forming a connecting mold layer 42 on the lower conductive layer 40. In an exemplary embodiment, the peripheral circuit structure PS includes a substrate 10, device isolation layers 12, impurity regions 14, transistors 20, contact plugs 30, peripheral circuit lines 32, and peripheral insulating layer 34. The device isolation layers 12 and the impurity regions 14 may be formed on an upper surface of the substrate 10. In an exemplary embodiment, the device isolation layer 12 includes an insulating layer made of, for example, silicon oxide or silicon nitride. The impurity region 14 may include an n-type impurity or a p-type impurity. The transistor 20 may be disposed adjacent to the impurity regions 14. The peripheral circuit line 32 may be disposed on the contact plugs 30. The peripheral circuit line 32 may be connected to the impurity regions 14 through the contact plug 30. The peripheral insulating layer 34 may cover the transistors 20, the contact plugs 30, and the peripheral circuit lines 32.

The lower conductive layer 40 may include metal, metal nitride, metal silicide, metal oxide, conductive carbon, polysilicon, or a combination thereof. In an exemplary embodiment of the inventive concept, the lower conductive layer 40 includes a doped polysilicon layer. In an exemplary embodiment, the connecting mold layer 42 includes the sacrificial layer 42*b*, and the passive layers 42*a* disposed at the upper and lower surfaces of the sacrificial layer 42*b*. The connecting mold layer 42 may include a material having etch selectivity with respect to the lower conductive layer 40. The passive layers 42*a* may include a material having etch selectivity with respect to the sacrificial layer 42*b*. In an exemplary embodiment, the passive layers 42*a* may include silicon oxide, and the sacrificial layer 42*b* may include silicon nitride.

Figure 15A:
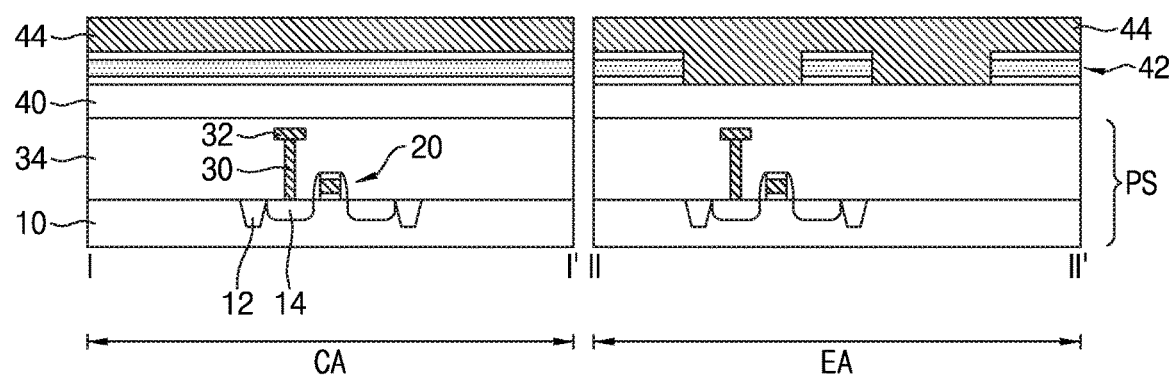
Figure 15B:
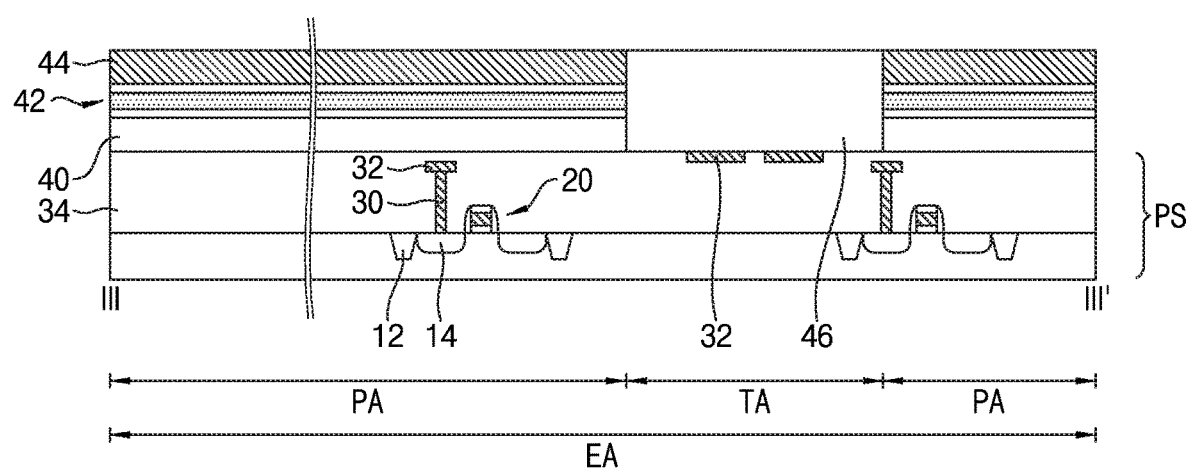

Referring to FIGS. 15A and 15B, the method includes partially removing the connecting mold layer 42, forming the supporter 44 on the lower conductive layer 40, and forming the buried insulating layer 46 on the peripheral circuit structure PS. The connecting mold layer 42 may be partially removed from the connecting area EA through a patterning process and, as such, an upper surface of the lower conductive layer 40 may be partially exposed. For example, an etching process may be performed to remove portions of the connecting mold layer 42. The supporter 44 may be formed to cover the exposed lower conductive layer 40 and the connecting mold layer 42. In an exemplary embodiment, the supporter 44 includes polysilicon.

The lower conductive layer 40, the connecting mold layer 42 and the supporter 44 may be partially removed from the TSV areas TA and, as such, an upper surface of the peripheral insulating layer 34 of the peripheral circuit structure PS may be partially exposed. The buried insulating layer 46 may be formed to cover the exposed peripheral insulating layer 34. Forming the buried insulating layer 46 may include performing a deposition process and a planarization process. In an exemplary embodiment of the inventive concept, the upper surface of the buried insulating layer 46 is disposed at the same level as the upper surface of the supporter 44.

Figure 16A:
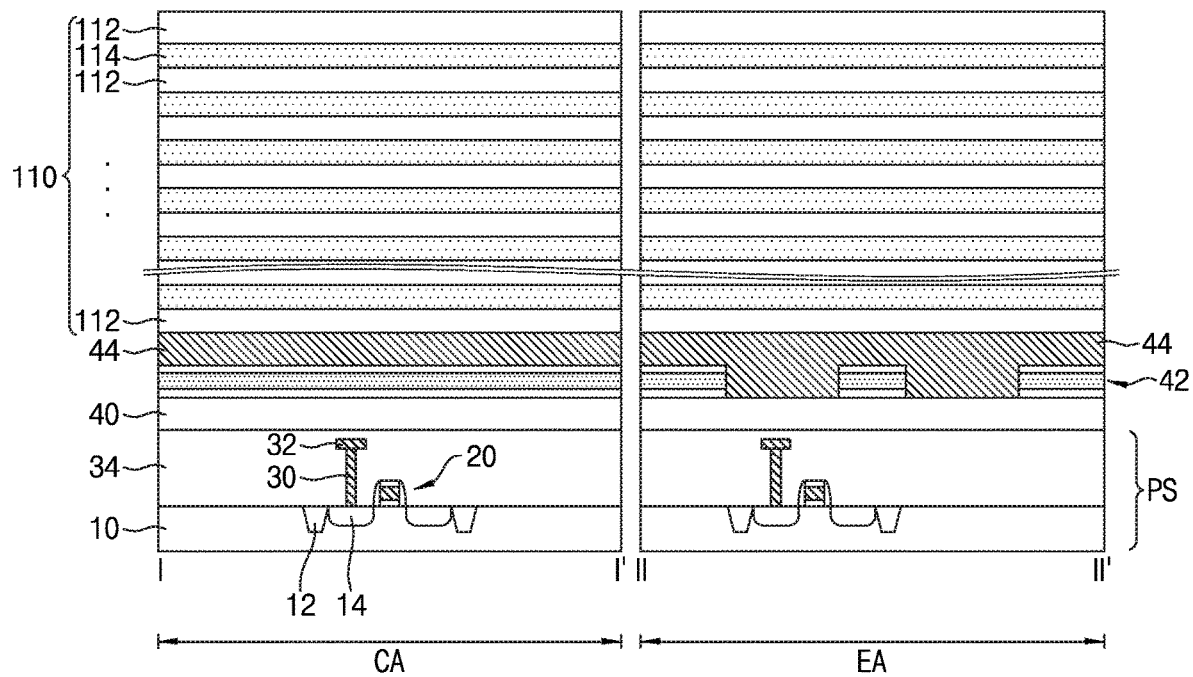
Figure 16B:
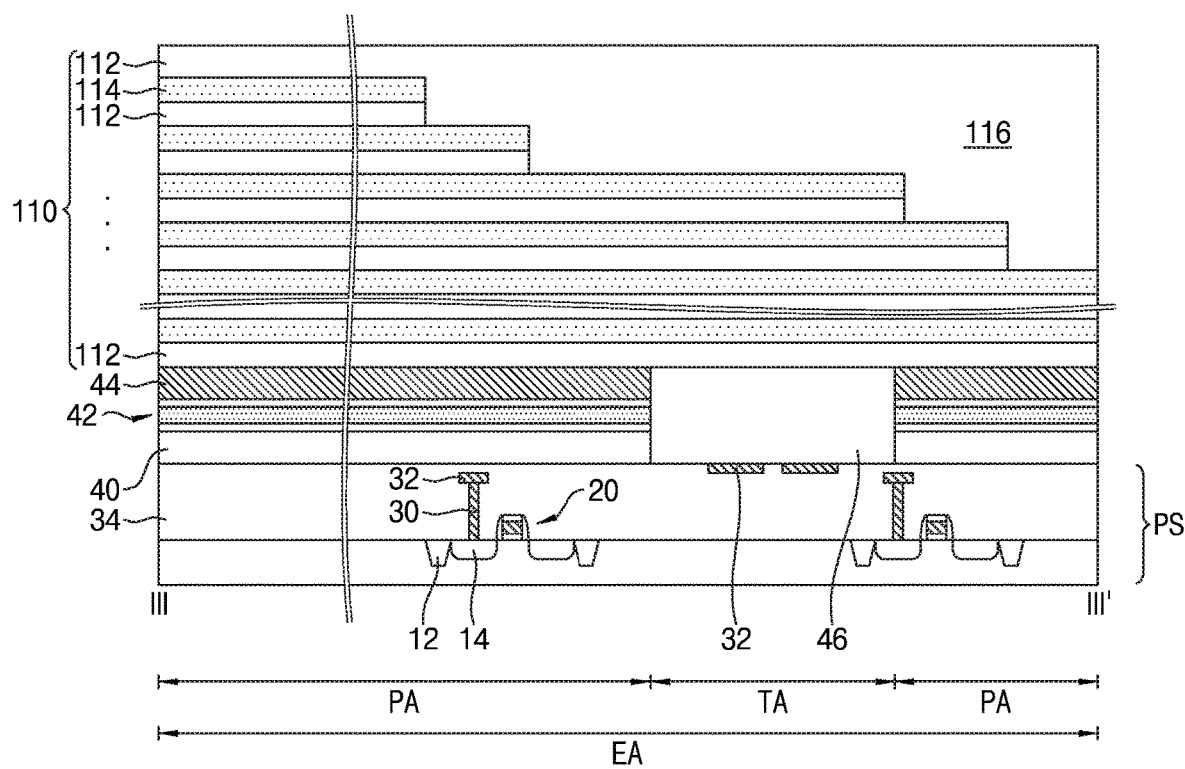

Referring to FIGS. 16A and 16B, the method includes forming the lower stack 110, and forming the lower interlayer insulating layer 116. The lower stack 110 may be formed on the supporter 44, and the lower interlayer insulating layer 116 may be formed on the lower stack 110. Forming the lower stack 110 may include performing a deposition process and a trimming process. The lower stack 110 may include a plurality of lower insulating layers 112, and a plurality of lower sacrificial layers 114 alternately stacked with the plurality of lower insulating layers 112. In an exemplary embodiment, the lower insulating layer 112 includes silicon oxide. In an exemplary embodiment, the lower sacrificial layer 114 includes silicon nitride. The lower stack 110 may have a stepped structure formed through a trimming process within the connecting area EA. The lower stack 110 may have a stepped structure formed through an etching process within the connecting area EA. In an exemplary embodiment, the connecting area EA includes TSV areas TA disposed between adjacent pad areas PA. The lower stack 110 may have a stepped structure in the pad area PA. In an exemplary embodiment, the lower stack 110 has no stepped structure in the TSV area TA while having a planar shape.

The lower interlayer insulating layer 116 may cover the lower stack 110 in the connecting areas EA. The lower interlayer insulating layer 116 may include silicon oxide, silicon nitride, silicon oxynitride, a low-k dielectric material, a high-k dielectric material, or a combination thereof. In an exemplary embodiment, the lower interlayer insulating layer 116 includes silicon oxide.

Figure 17A:
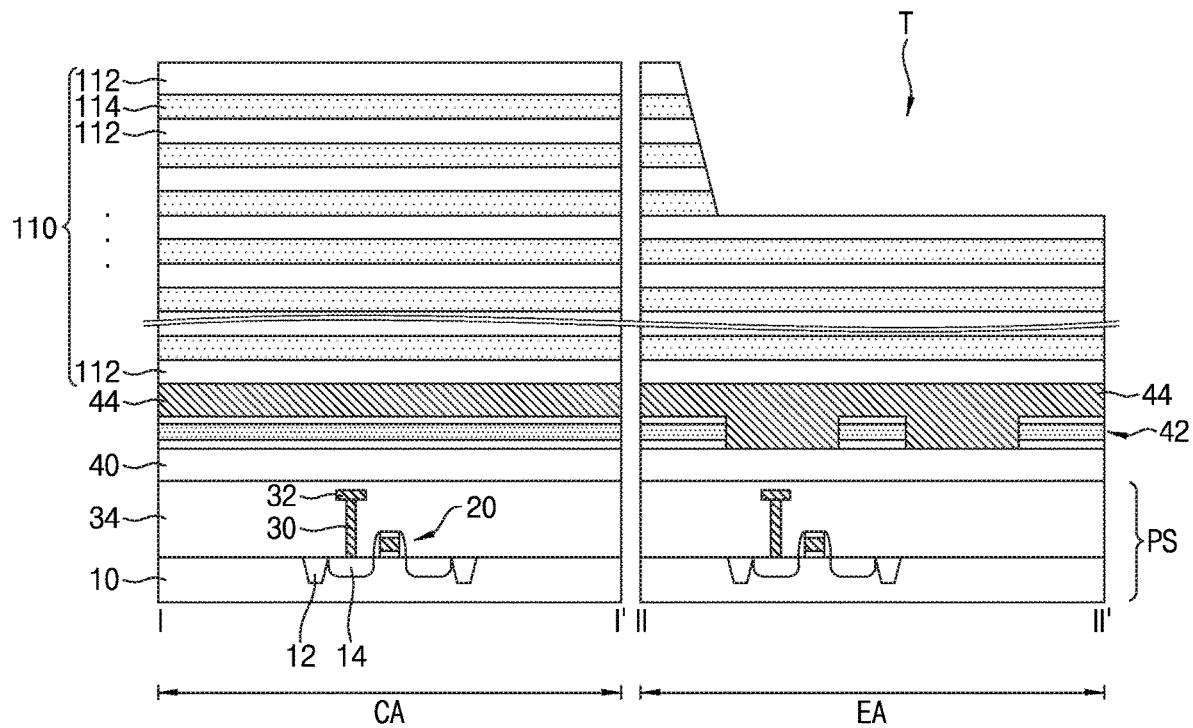
Figure 17B:
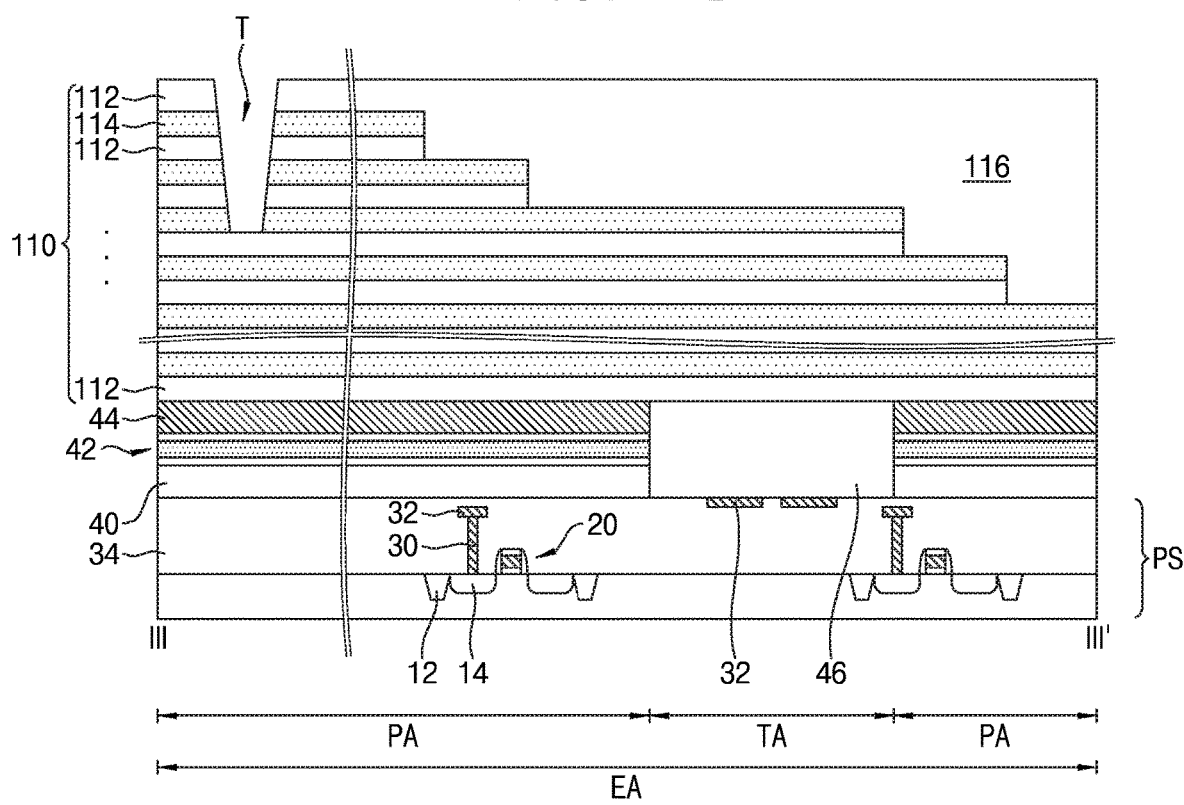

Referring to FIGS. 17A and 17B, the method includes forming trenches T at an upper portion of the lower stack 110. The trench T may be formed through anisotropic etching of the upper portion of the lower stack 110 and, as such, a plurality of lower sacrificial layers 114 may be cut out. For example, portions of some of the lower sacrificial layers 114 and insulating layers 112 may be removed to form the trench T. In an exemplary embodiment, the trench T is formed at the pad area PA disposed between the cell array area CA and the TSV areas TA. The trench T may extend in one direction. A lower surface of the trench T may expose the lower insulating layer 112, but is not limited thereto. In an exemplary embodiment of the inventive concept, the lower surface of the trench T is formed to expose a lower sacrificial layer 114 or an insulating layer 112.

Figure 18A:
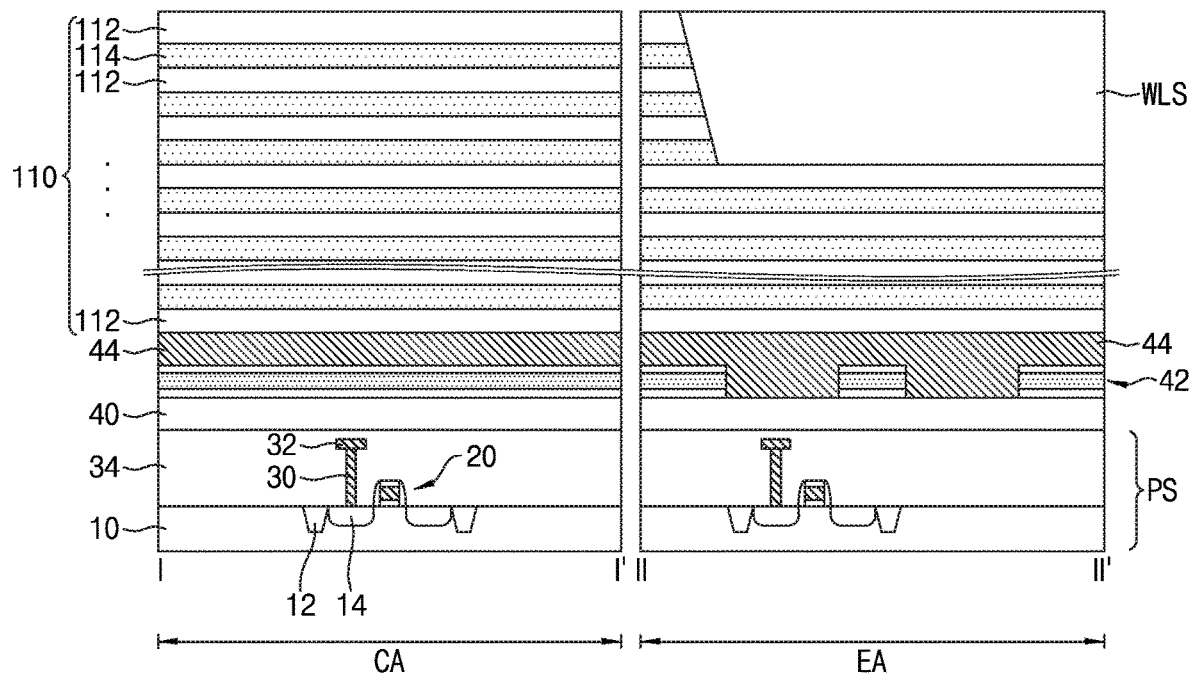
Figure 18B:
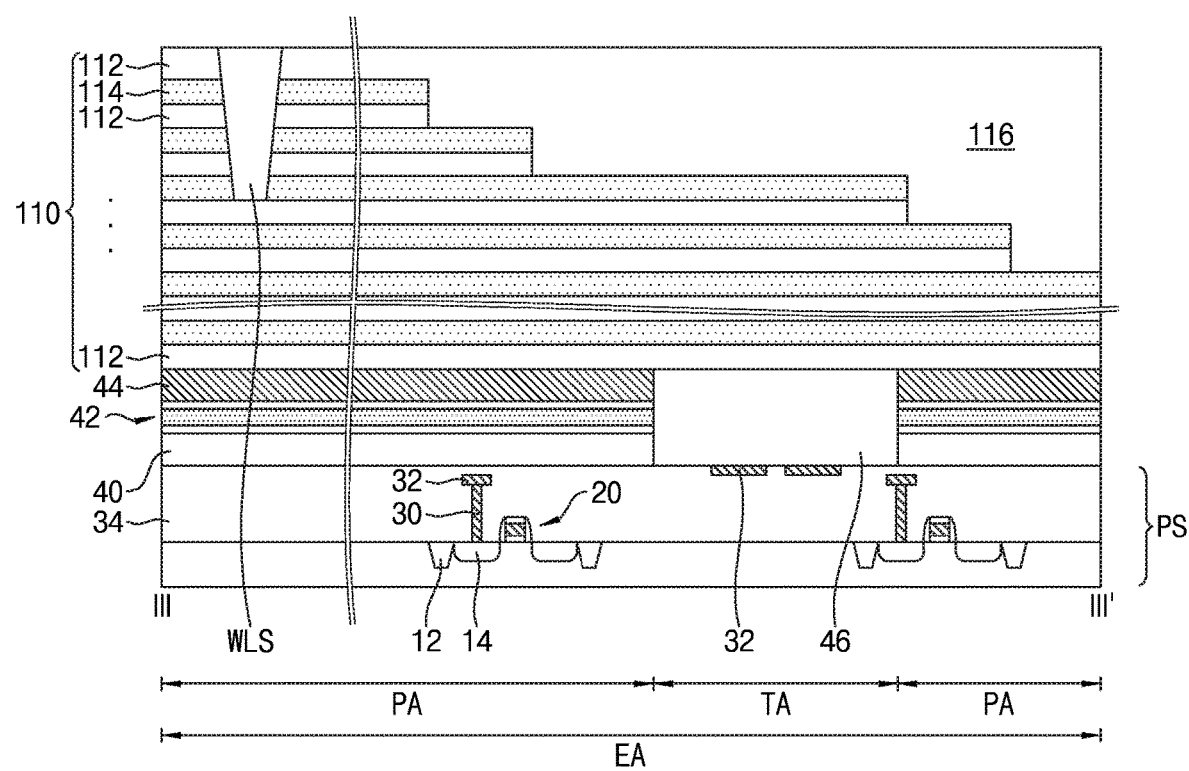

Referring to FIGS. 18A and 18B, the method includes forming the word line separation layers WLS within the trenches T. Forming the word line separation layers WLS may include performing a deposition process and a planarization process. The word line separation layer WLS may have a tapered shape having a width gradually reduced while extending downwards. The word line separation layer WLS may include silicon oxide, silicon nitride, silicon oxynitride, a low-k dielectric material, a high-k dielectric material, or a combination thereof. The word line separation layer WLS may include a material having etch selectivity with respect to the lower sacrificial layers 114. For example, the word line separation layer WLS may include silicon oxide.

Figure 19A:
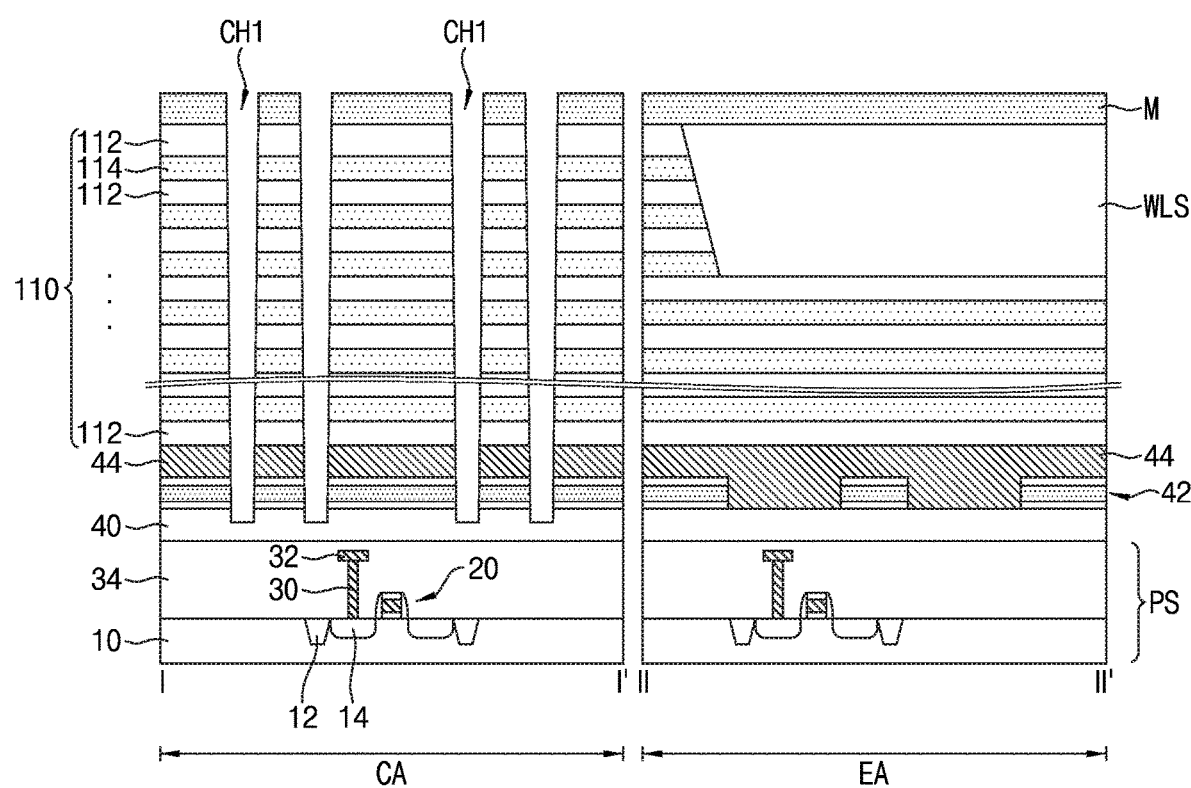
Figure 19B:
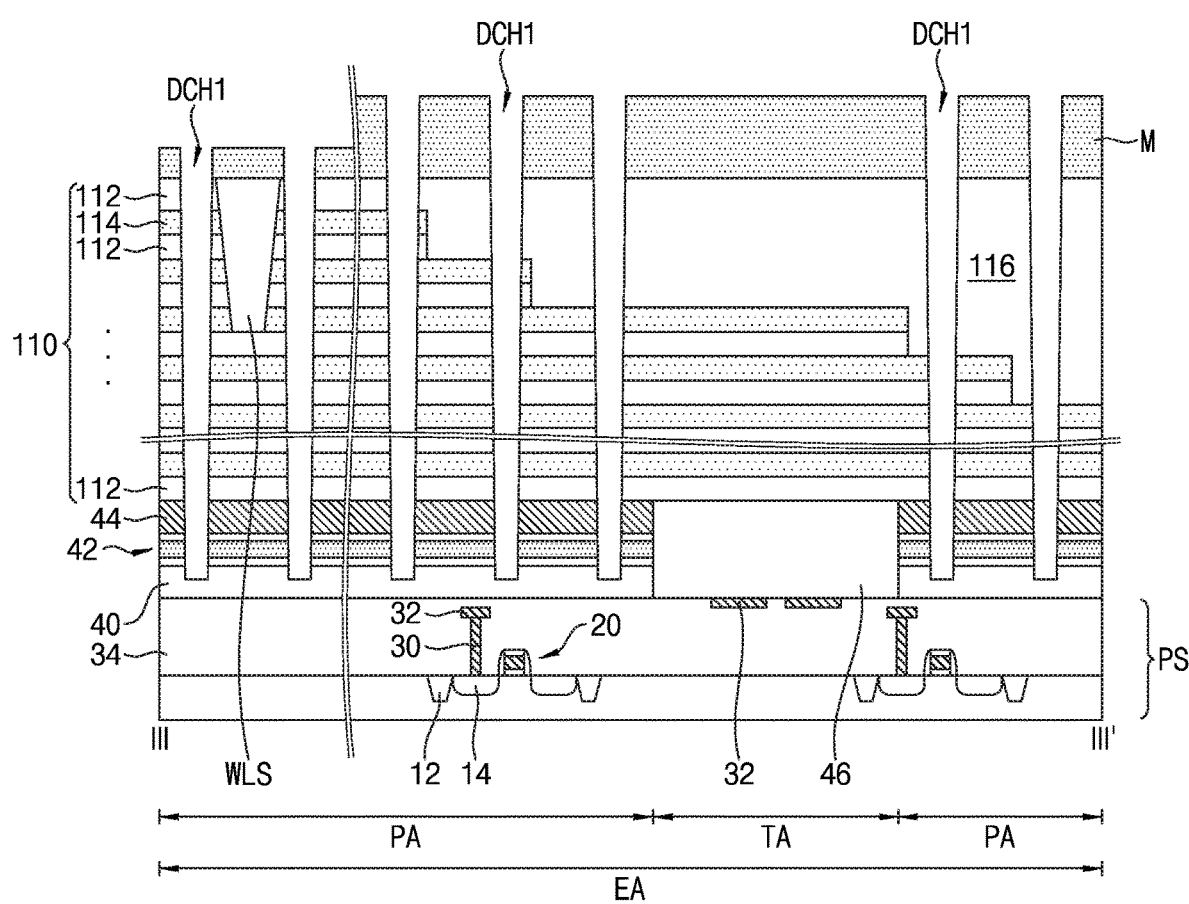

Referring to FIGS. 19A and 19B, the method includes forming lower channel holes CH1 and lower dummy channel holes DCH1. The lower channel holes CH1 may extend vertically through the lower stack 110 in the cell array area CA to expose the lower conductive layer 40. The lower dummy channel holes DCH1 may extend vertically through the lower stack 110 and the lower interlayer insulating layer 116 in the connecting areas EA to expose the lower conductive layer 40. In an exemplary embodiment of the inventive concept, the lower dummy channel holes DCH1 are not disposed in the TSV areas TA. The lower channel holes CH1 and the lower dummy channel holes DCH1 may be formed through an anisotropic etching process using a hard mask M disposed on the lower stack 110 and the lower interlayer insulating layer 116. Since no lower dummy channel hole DCH1 is formed in the TSV areas TA, the hard mask M may be relatively slightly etched in the TSV areas TA, as compared to the remaining areas. The hard mask M may have a greater height around the TSV areas TA than a height around the cell array area CA.

Figure 20A:
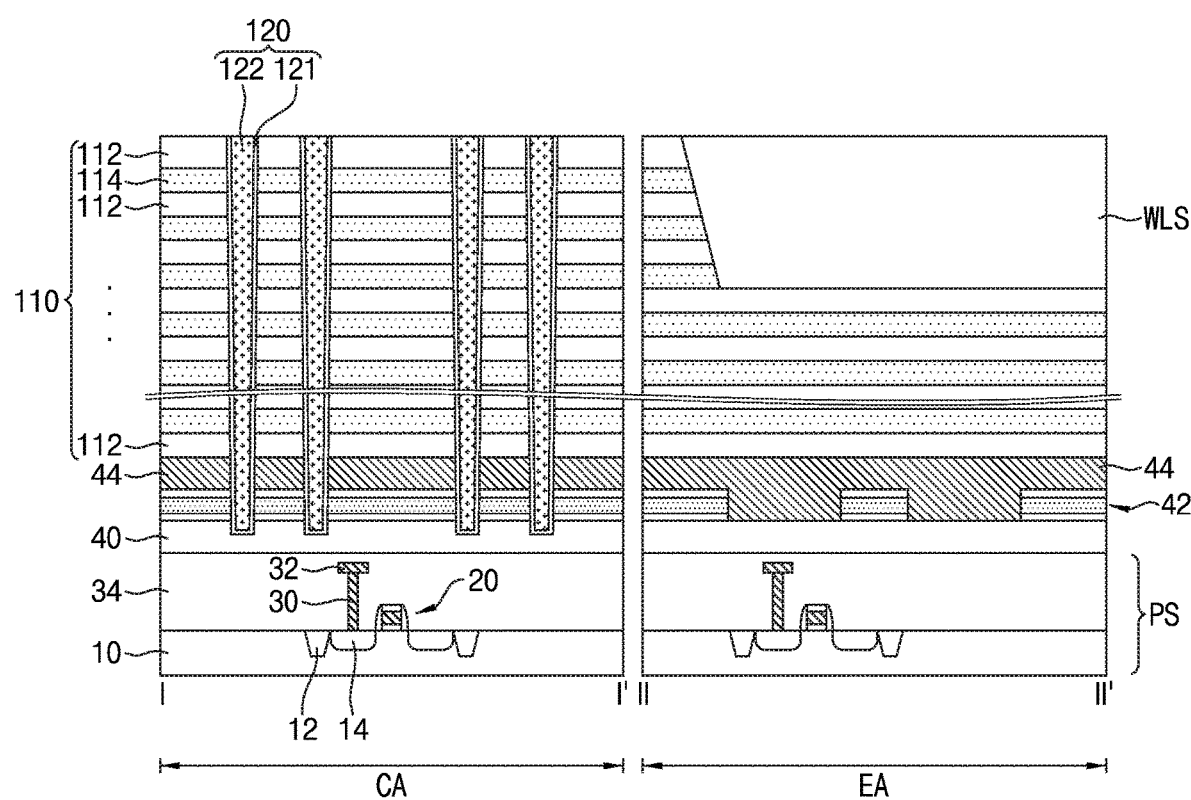
Figure 20B:
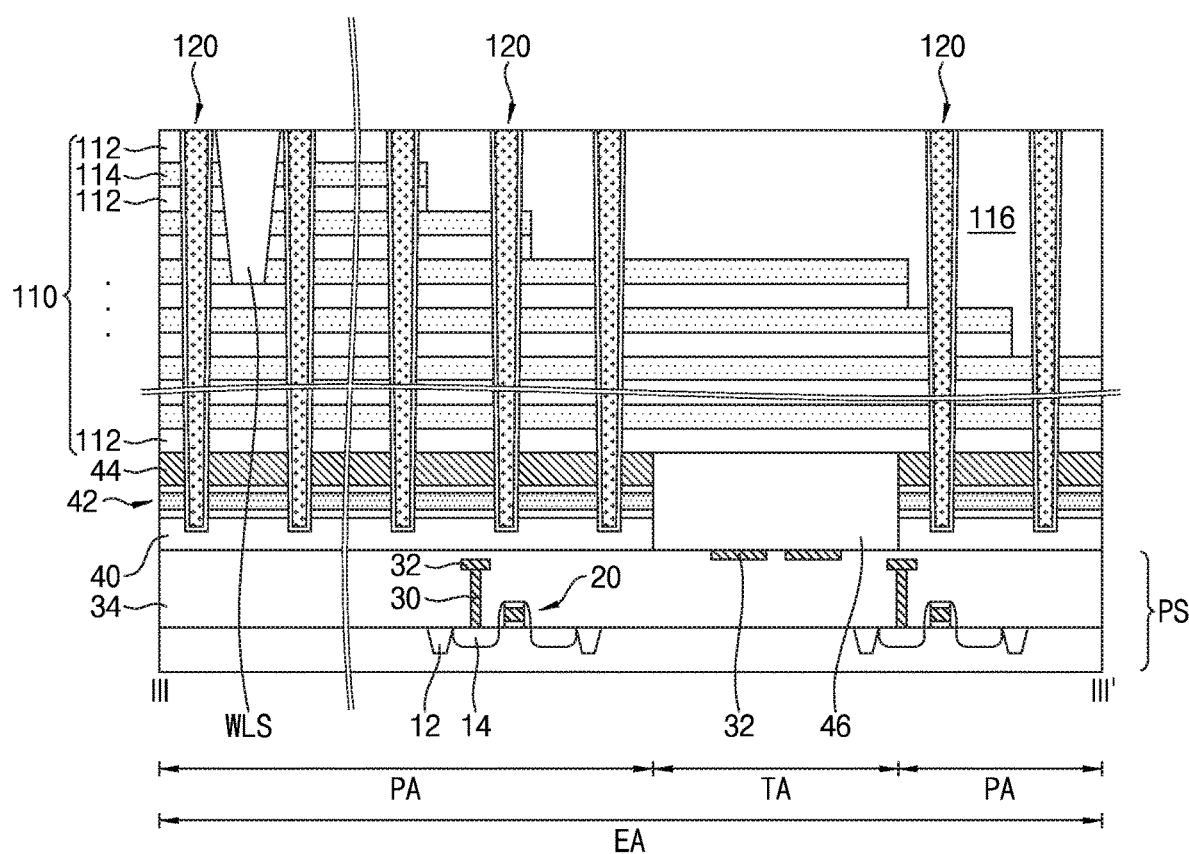

Referring to FIGS. 20A and 20B, the method includes forming channel sacrificial layers 120 within the lower channel holes CH1 and the lower dummy channel holes DCH1. In an exemplary embodiment, the channel sacrificial layer 120 includes a first sacrifice material 121 and a second sacrifice material 122. The first sacrifice material 121 may be conformally formed within the lower channel holes CH1 and the lower dummy channel holes DCH1. The second sacrifice material 122 may be formed on the first sacrifice material 121 while filling the lower channel holes CH1 and the lower dummy channel holes DCH1. In an exemplary embodiment, the first sacrifice material 121 includes silicon nitride, and the second sacrifice material 122 includes polysilicon.

Figure 21A:
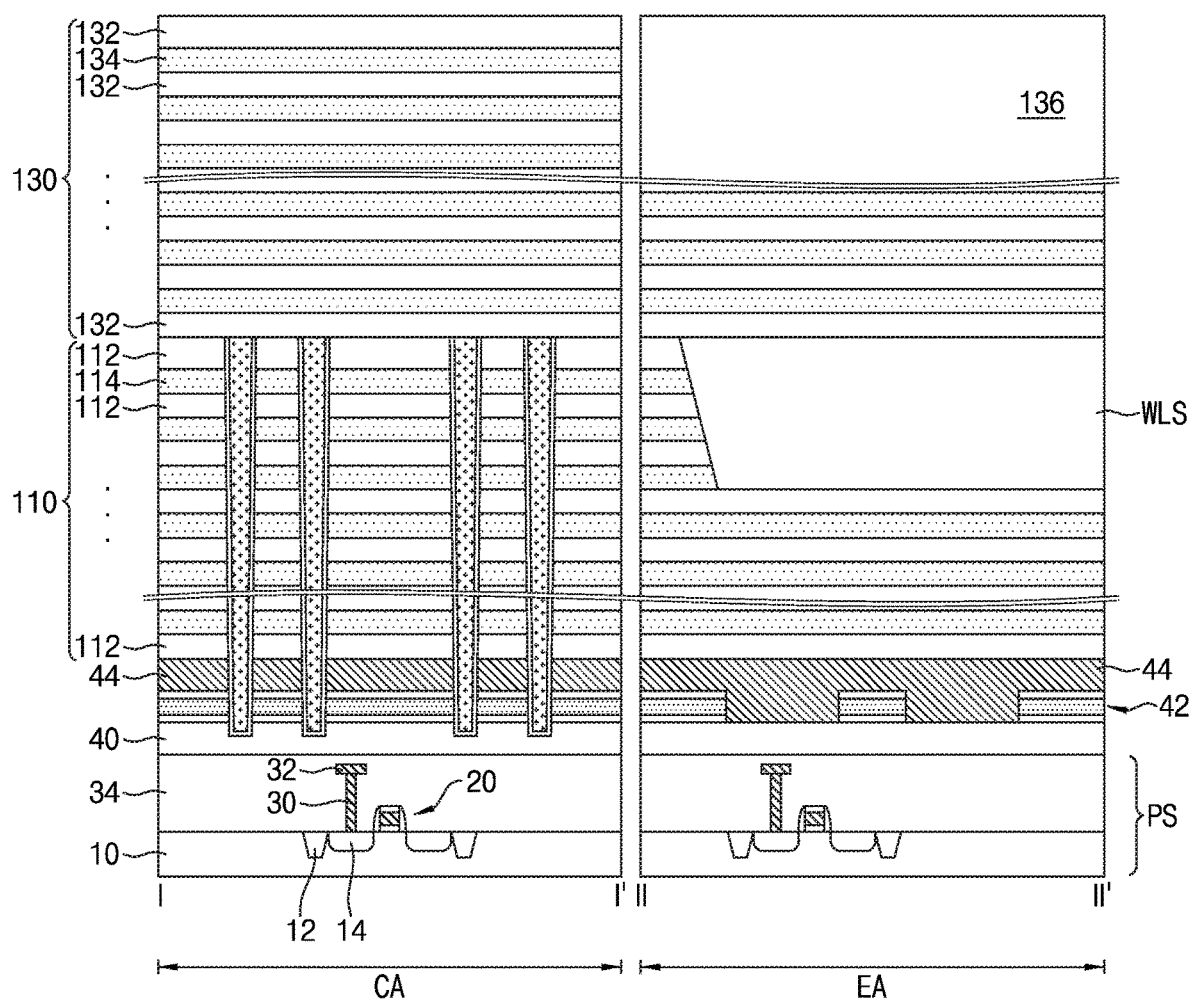
Figure 21B:
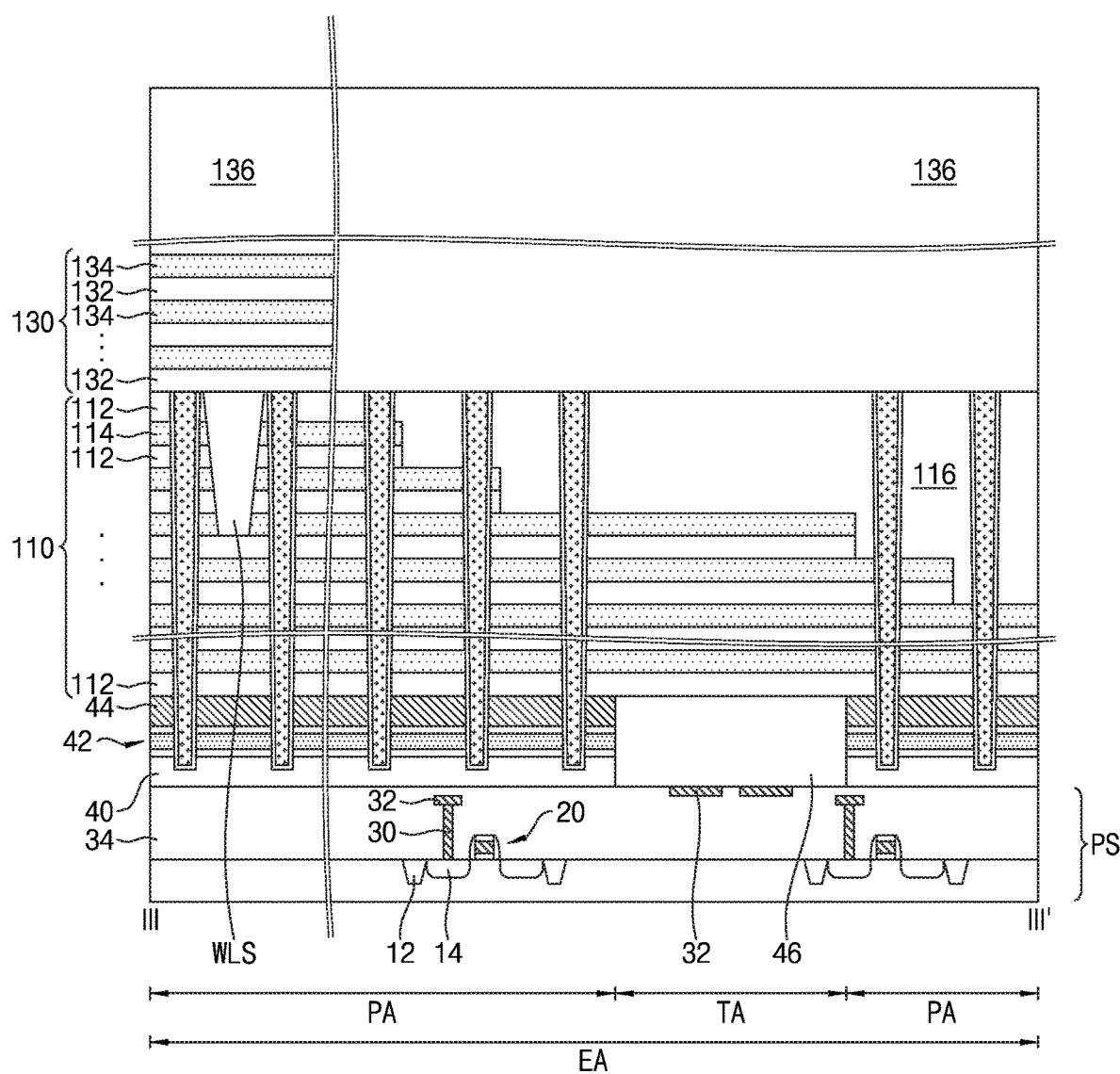

Referring to FIGS. 21A and 21B, the method includes forming the upper stack 130 and the upper interlayer insulating film 136. Forming the upper stack 130 may include performing a deposition process and a trimming process. The upper stack 130 may be formed on the lower stack 110 and the upper insulating layer 136 may be formed on the upper stack 130. The upper stack 130 may include a plurality of upper insulating layers 132, and a plurality of upper sacrifice insulating layers 134 alternately stacked with the upper insulating layers 132. The upper insulating layers 132 may include the same material as the lower insulating layers 112, and the upper sacrificial layers 134 may include the same material as the lower sacrificial layers 114. The upper stack 130 may have a stepped structure in the connecting area EA. The upper interlayer insulating layer 136 may cover the upper stack 130 in the connecting area EA. The upper interlayer insulating layer 136 may include the same material as the lower interlayer insulating layer 116.

Figure 22A:
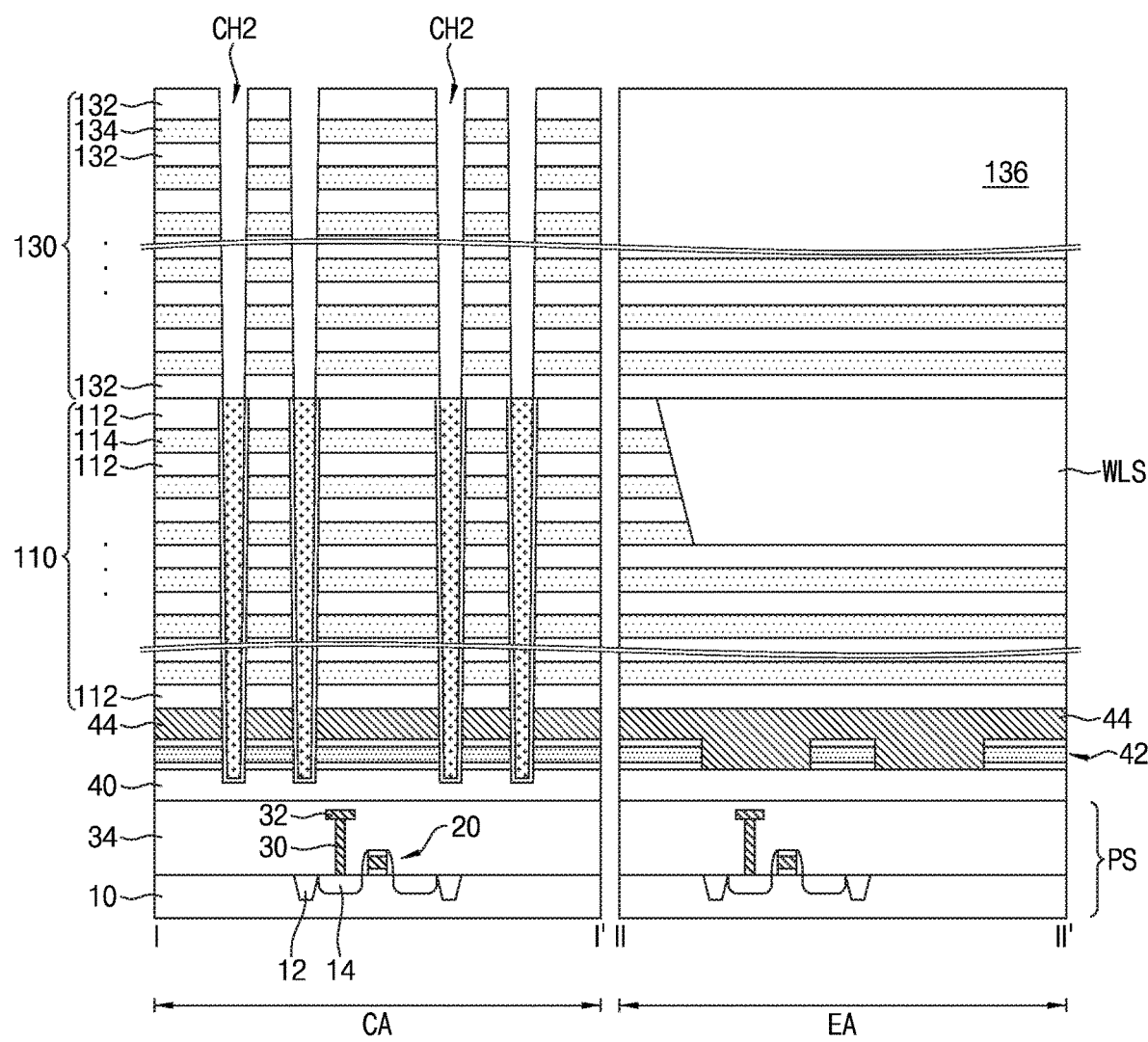
Figure 22B:
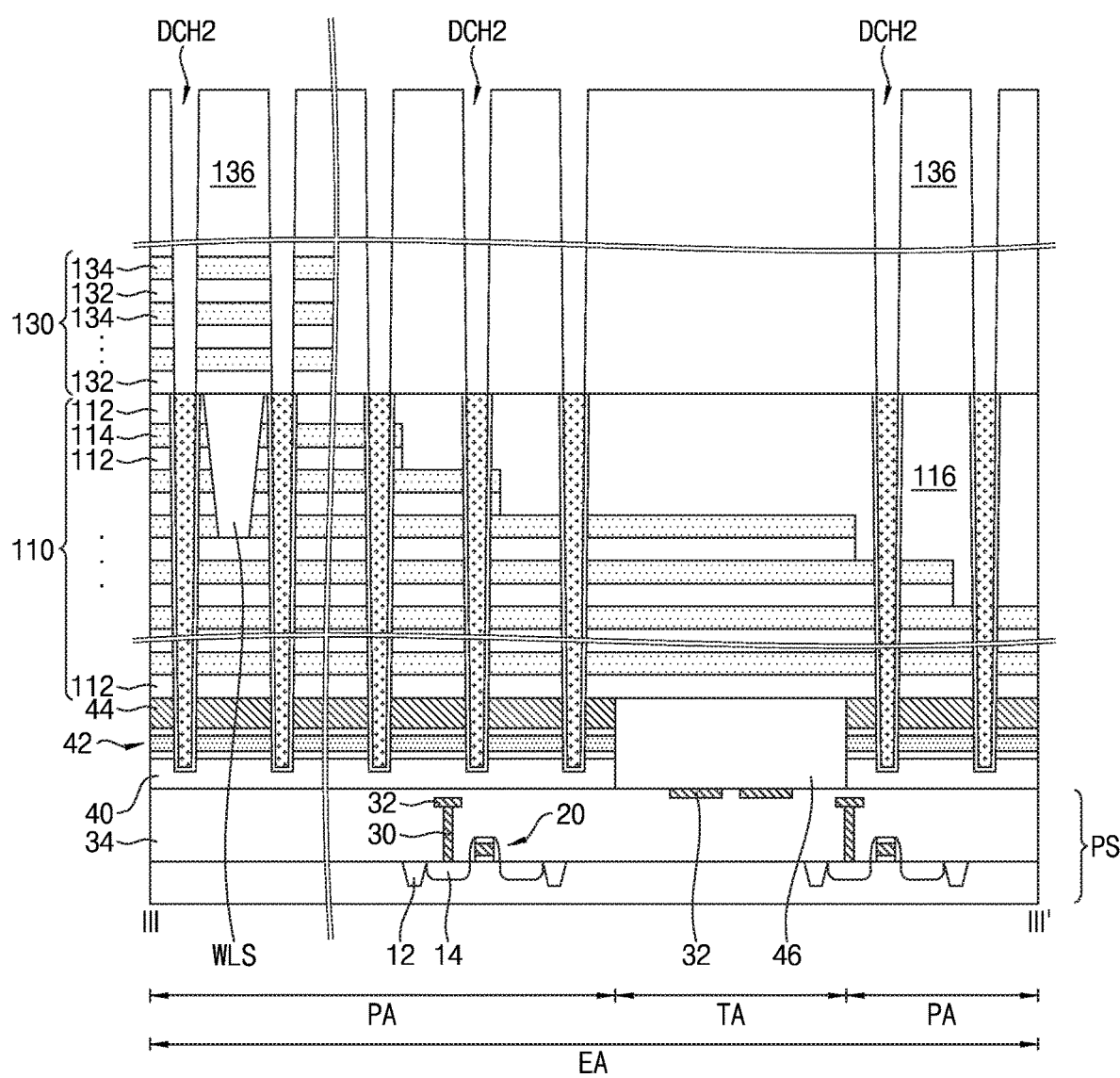

Referring to FIGS. 22A and 22B, the method includes forming upper channel holes CH2 and upper dummy channel holes DCH2. The upper channel holes CH2 may be disposed on corresponding ones of the lower channel holes CH1, respectively. The upper channel holes CH2 may expose the channel sacrificial layers 120 while extending vertically through the upper stack 130 in the cell array area CA. The upper dummy channel holes DCH2 may be disposed on corresponding ones of the lower dummy channel holes DCH1, respectively. The upper dummy channel holes DCH2 may expose the channel sacrificial layers 120 while extending vertically through the upper stack 130 and the upper interlayer insulating layer 136 in the connecting area EA. In an exemplary embodiment, no upper dummy channel hole DCH2 is disposed in the TSV area TA.

Figure 23A:
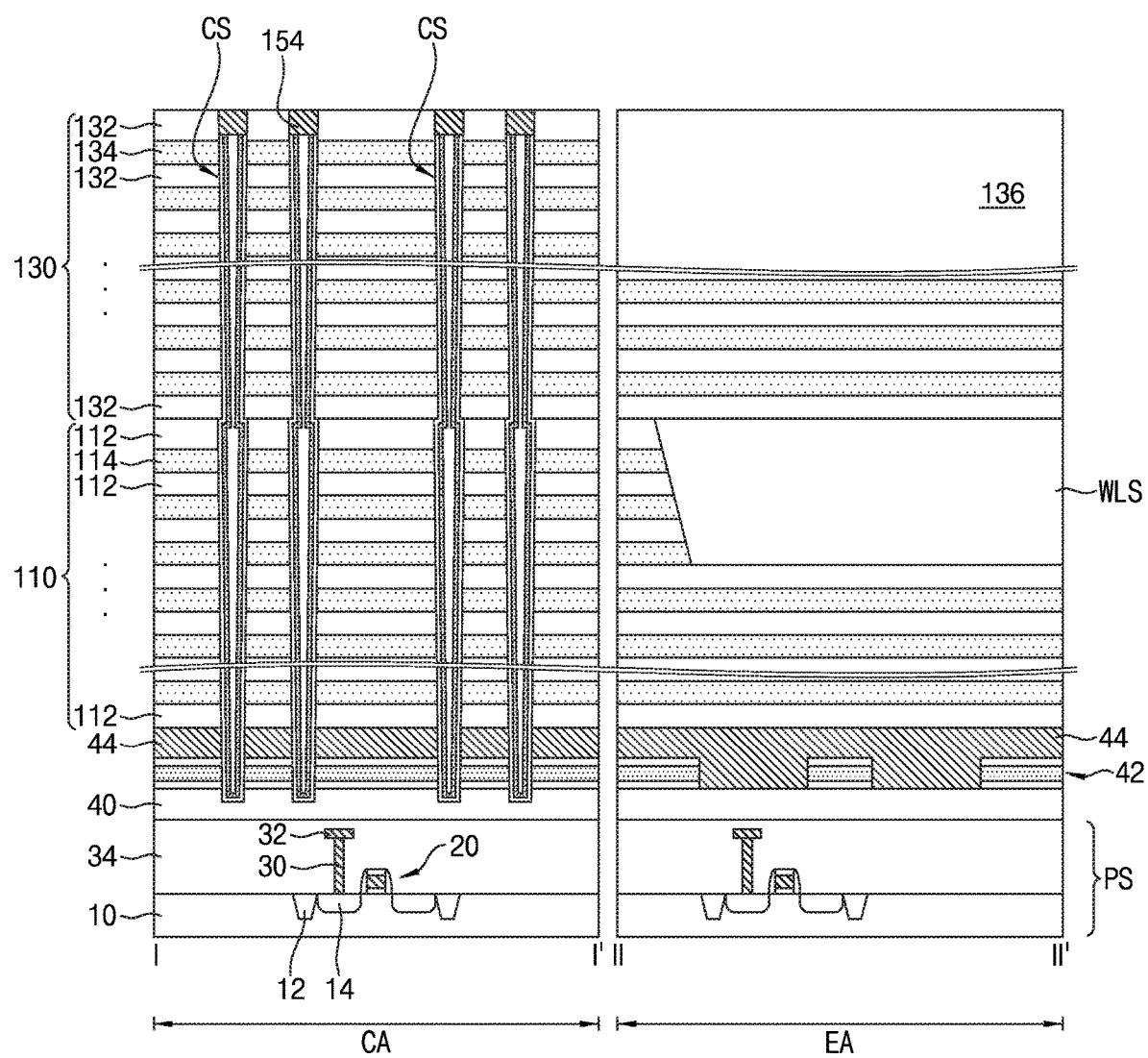
Figure 23B:
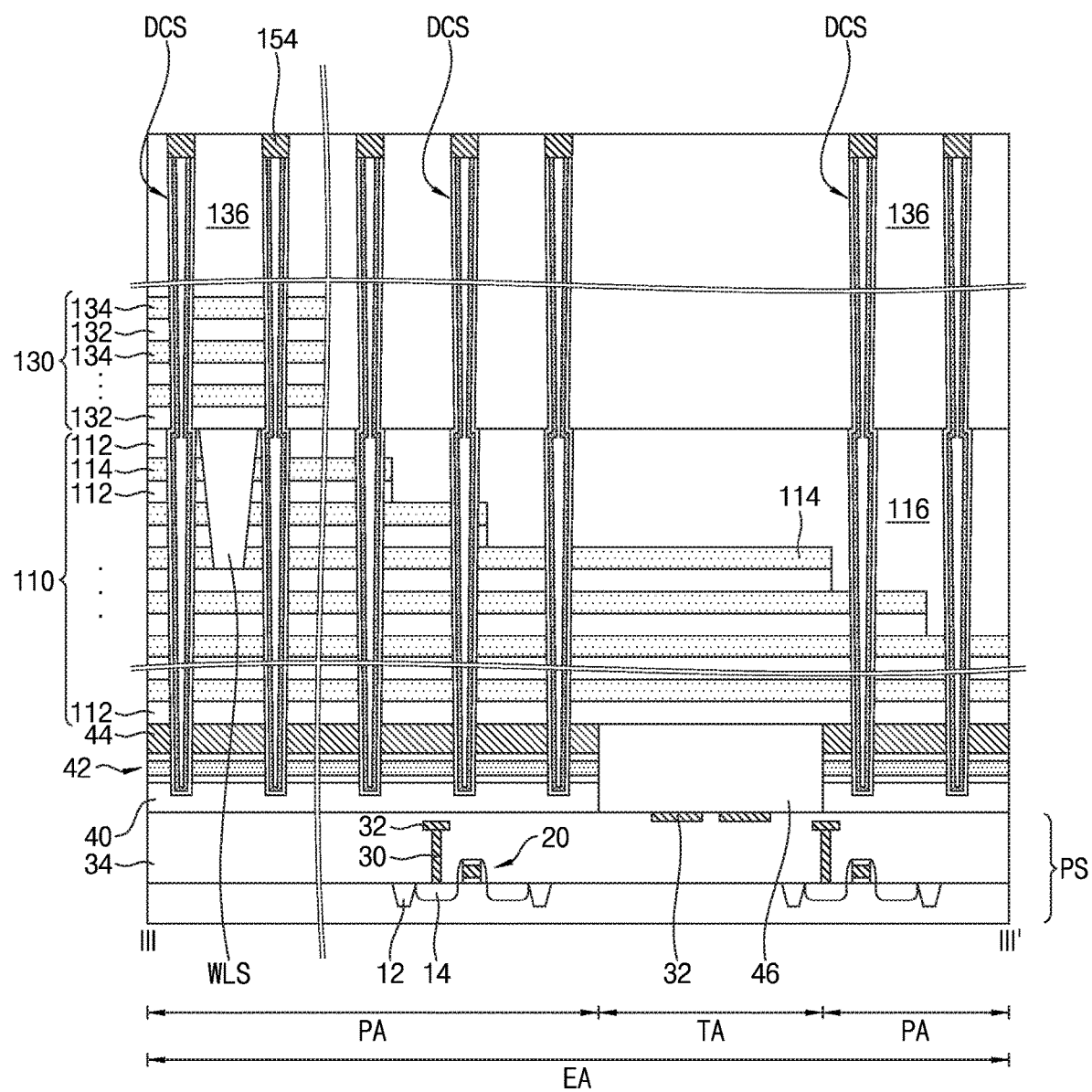

Referring to FIGS. 23A and 23B, the method includes removing the channel sacrificial layers 120, forming the channel structures CS, and forming the dummy channel structures DCS. The removing of the channel sacrificial layers 120 may include forming a sacrifice material within the upper channel holes CH2 and the upper dummy channel holes DCH2. The sacrifice material may include the same material as the first sacrifice material 121 and the second sacrifice material 122. As the channel sacrificial layers 120 and the sacrifice material are removed, the lower channel holes CH1 may be connected to respective upper channel holes CH2, and the lower dummy channel holes DCH1 may be connected to respective upper dummy channel holes DCH2.

The channel structures CS are formed within the lower channel holes CH1 and the upper channel holes CH2. The dummy channel structures DCS are formed within the lower dummy channel holes DCH1 and the upper dummy channel holes DCH2. The conductive pads 154 may be formed on the channel structures CS and the dummy channel structures DCS. The conductive pad 154 may include a conductive layer of metal, metal nitride, metal oxide, metal silicide, conductive carbon, polysilicon or a combination thereof.

The dummy channel structure DCS may have the same structure as the channel structure CS. Although the dummy channel structure DCS is illustrated as not overlapping with the word line separation layer WLS in FIG. 23B, embodiments of the present disclosure are not limited thereto. In an exemplary embodiment of the inventive concept, the dummy channel structure DCS extends vertically through the word line separation layer WLS.

Figure 24A:
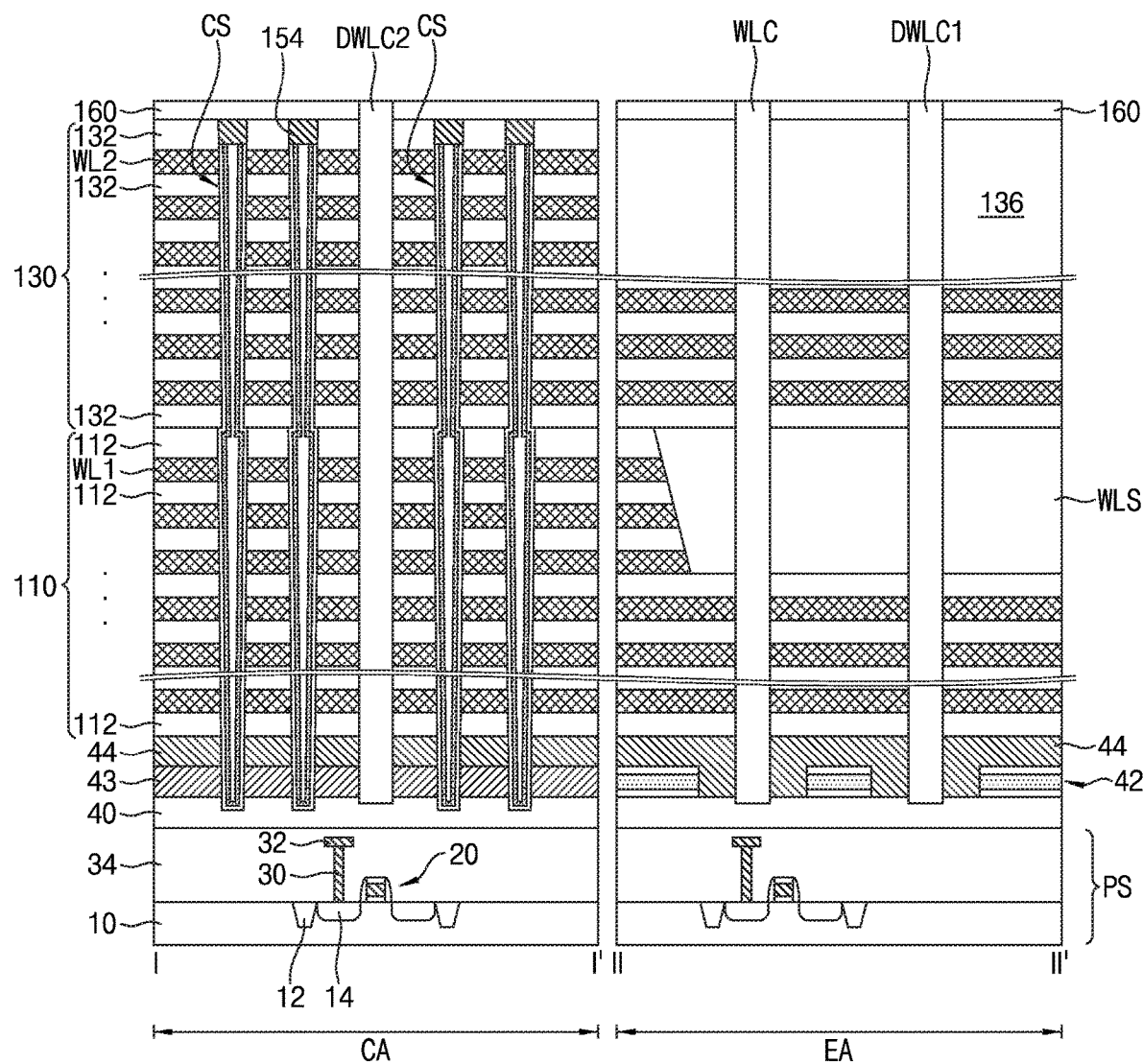
Figure 24B:
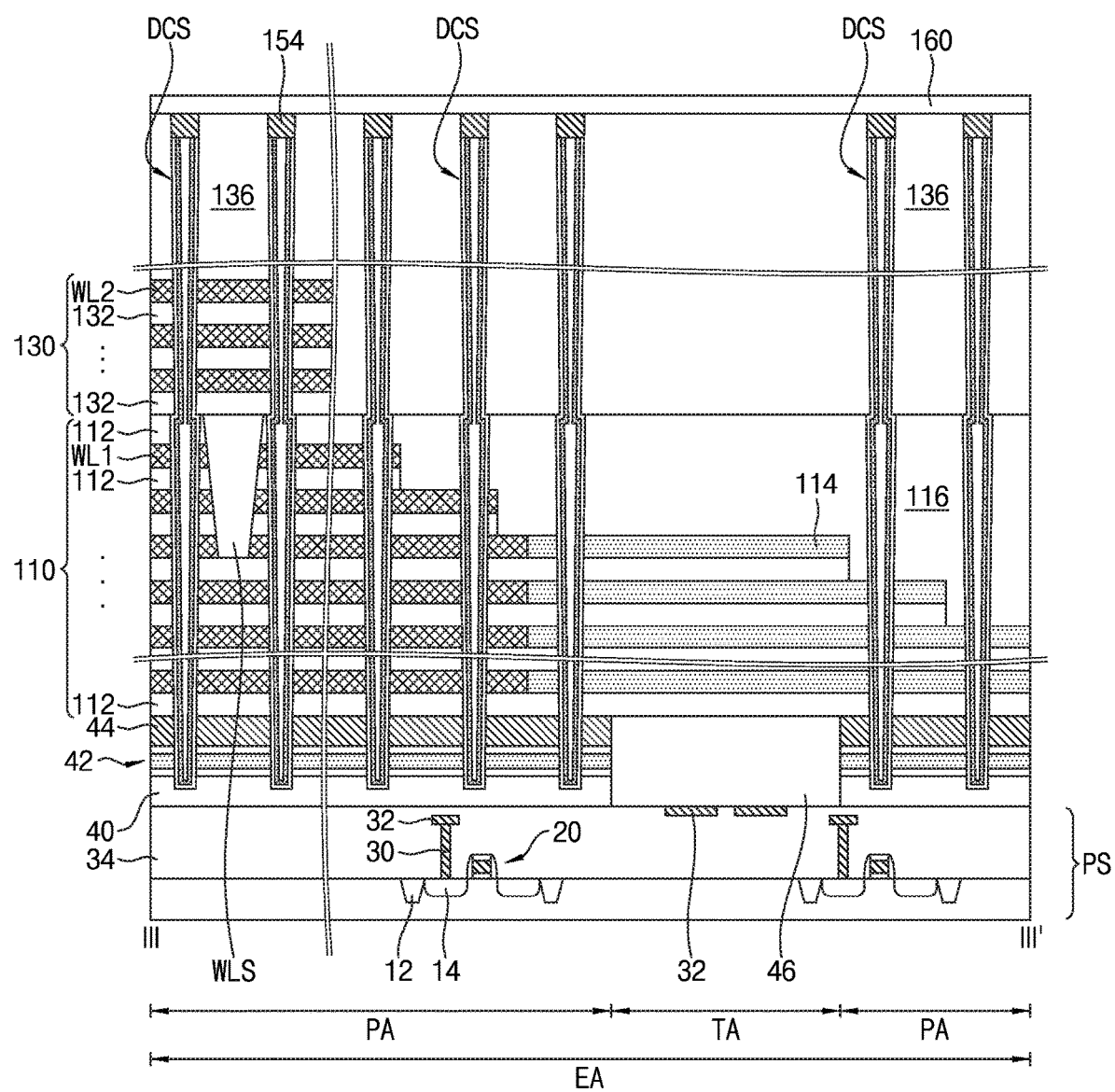

Referring to FIGS. 24A and 24B, the method includes forming the connecting conductive layer 43, forming the lower word lines WL1 and the upper word lines WL2, and forming the separation insulating layers WLC and the dummy separation insulating layers DWLC1 and DWLC2. Forming the connecting conductive layer 43 may include removing the connecting mold layer 42. In an exemplary embodiment, the lower stack 110 and the upper stack 130 are vertically anisotropically etched such that the lower conductive layer 40 and the connecting mold layer 42 are partially exposed. The exposed connecting mold layer 42 may be selectively removed through an isotropic etching process. The connecting conductive layer 43 may be formed in a space from which the connecting mold layer 42 is removed. Referring to FIG. 5, side surfaces of the information storage layer 140 are partially etched before forming the connecting conductive layer 43 and, as such, the channel layer 150 may be exposed. The connecting conductive layer 43 may contact the channel layers 150. The connecting conductive layer 43 may include metal, metal nitride, metal oxide, metal silicide, polysilicon, conductive carbon, or a combination thereof.

Forming of the lower word lines WL1 and the upper word lines WL2 may include removing the lower sacrificial layers 114 and the upper sacrificial layers 134. The lower sacrificial layers 114 may be selectively removed, and the lower word line WL1 may then be formed between the lower insulating layers 112. Similarly, the upper sacrificial layers 134 may be selectively removed, and the upper word line WL2 may then be formed between the upper insulating layers 132. The lower word lines WL1 and the lower insulating layers 112 may constitute the lower stack 110, and the upper word lines WL2 and the upper insulating layers 132 may constitute the upper stack 130. In an exemplary embodiment, the lower sacrificial layers 114 are not removed from the TSV areas TA and areas therearound. The lower word lines WL1 and the upper word lines WL2 may include tungsten W, tungsten nitride WN, titanium Ti, titanium nitride TiN, tantalum Ta, tantalum nitride TaN or a combination thereof.

The separation insulating layers WLC and the dummy separation insulating layers DWLC1 and DWLC2 may extend vertically through the lower stack 110, the upper stack 130 and the word line separation layers WLS. The first upper insulating layers 132 may be formed on the upper stack 130. The separation insulating layers WLC and the dummy separation insulating layers DWLC1 and DWLC2 may extend through the first upper insulating layer 132. As shown in FIG. 2, the separation insulating layers WLC and the dummy separation insulating layers DWLC1 and DWLC2 may extend in a direction crossing the word line separation layers WLS. The separation insulating layer WLC may extend from the cell array CA to a connecting area EA. The dummy separation insulating layers DWLC1 and DWLC2 may extend in the same direction as the separation insulating layers WLC while being alternately disposed with the separation insulating layers WLC. The dummy separation insulating layer DWLC1 may be disposed in the connecting areas EA, whereas the dummy separation insulating layer DWLC2 may be disposed in an area extending from the cell array area CA to the connecting areas EA. The separation insulating layers WLC and the dummy separation insulating layers DWLC1 and DWLC2 may include silicon oxide, silicon nitride, silicon oxynitride, or a combination thereof.

Referring back to FIGS. 2, 3A and 3B, the method may include forming the second upper insulating layer 132, the bit line plugs 164, the bit lines 166, the TSVs 170, and the connecting lines 172. The second upper insulating layer 132 may be formed on the first upper insulating layer 132. The bit line plugs 164 may be formed to extend through the first upper insulating layer 132 and the second upper insulating layer 132. The bit lines 166 may be formed on the second upper insulating layer 132, and may be connected to the bit line plugs 164.

The TSVs 170 may be formed within the TSV areas TA. The TSV 170 may extend vertically through the buried insulating layer 46, the lower stack 110, the lower interlayer insulating layer 116, the upper stack 130, the upper interlayer insulating layer 136, the first upper insulating layer 132, and the second upper insulating layer 132 and, as such, may be electrically connected to the connecting lines 172. The connecting lines 172 may be formed on the second upper insulating layer 132. The connecting lines 172 may be electrically connected to the peripheral circuit lines 32 through the TSVs 170.

The first upper insulating layer 132 and the second upper insulating layer 132 may include silicon oxide, silicon nitride, silicon oxynitride, or a combination thereof. The bit line plugs 164, the bit lines 166, the TSVs 170 and the connecting lines 172 may include metal, metal nitride, metal oxide, metal silicide, polysilicon, conductive carbon, or a combination thereof.

As shown in FIG. 19B, the hard mask M may have a greater height around the TSV areas TA than a height around the cell array area CA and, as such, there may be a possibility of misalignment between the lower dummy channel holes DCH1 and the upper dummy channel holes DCH2. The word line separation layer WLS may be disposed between the cell array area CA and the TSV areas TA to separate the lower word lines WL1 of the lower stack 110. Accordingly, the word line separation layers WLS may electrically insulate the lower word lines WL1 in the cell array area CA from the lower word lines WL1 in the connecting areas EA. Thus, reliability caused by word line bridging resulting from misalignment may be improved.

Although exemplary embodiments of the present inventive concept have been described above, those of ordinary skill in the art will appreciate that various modifications, additions and substitutions are possible, without departing from the scope and spirit of the disclosure.

What is claimed is:

1. A semiconductor device comprising:
a substrate including a cell array area and a connecting area, the connecting area including a through-silicon-via (TSV) area;
a peripheral circuit structure disposed on the substrate;
a lower stack disposed on the peripheral circuit structure and an upper stack disposed on the lower stack, the lower stack including a plurality of lower insulating layers and a plurality of lower word lines alternately stacked with the lower insulating layers;
a plurality of channel structures extending through the lower stack and the upper stack in the cell array area;
a plurality of dummy channel structures extending through the lower stack and the upper stack in the connecting area;
a pair of separation insulating layers WLC extending vertically through the lower stack and the upper stack and extending in a first horizontal direction, the pair of separation insulating layers being spaced apart from each other in a second horizontal direction crossing the first horizontal direction; and
a word line separation layer WLS disposed at an upper portion of the lower stack and crossing the pair of separation insulating layers when viewed in a plan view, the word line separation layer extending vertically through at least one of the lower word lines and extending in the second horizontal direction.

2. The semiconductor device according to claim 1, wherein the word line separation layer is disposed between the cell array area and the TSV area.

3. The semiconductor device according to claim 1, further comprising:
a lower interlayer insulating layer covering the lower stack, wherein an upper surface of the word line separation layer is disposed at the same level as an upper surface of the lower interlayer insulating layer.

4. The semiconductor device according to claim 1, wherein the word line separation layer is disposed between the dummy channel structures.

5. The semiconductor device according to claim 1, wherein the pair of separation insulating layers extend completely through the word line separation layer when viewed in a longitudinal sectional view.

6. The semiconductor device according to claim 1, wherein lateral end portions of the word line separation layer are disposed outside the pair of separation insulating layers.

7. The semiconductor device according to claim 1, further comprising:
a TSV disposed in the TSV area, the TSV extending through the upper stack and the lower stack and connected to the peripheral circuit structure.

8. The semiconductor device according to claim 1, wherein at least one of the dummy channel structures extends vertically through the word line separation layer.

9. The semiconductor device according to claim 1, further comprising:
a plurality of dummy separation insulating layers disposed between the pair of separation insulating layers and spaced apart from one another in the second horizontal direction.

10. The semiconductor device according to claim 9, wherein the word line separation layer crosses the dummy separation insulating layers.

11. The semiconductor device according to claim 9, wherein the word line separation layer is disposed between the TSV area and the plurality of dummy separation insulating layers.

12. The semiconductor device according to claim 1, wherein:
the lower stack has a stepped structure in the connecting area; and the word line separation layer extends through a portion of the stepped structure.

13. The semiconductor device according to claim 12, further comprising:
a lower interlayer insulating layer covering the lower stack, wherein an upper surface of the word line separation layer is disposed at a lower level than an upper surface of the lower interlayer insulating layer.

14. The semiconductor device according to claim 1, wherein a cross-section of the word line separation layer in the second horizontal direction contacts side surfaces of the pair of separation insulating layers.

15. The semiconductor device according to claim 1, wherein the word line separation layer electrically insulates portions of the lower word lines from the channel structures.

16. The semiconductor device according to claim 1, wherein the word line separation layer extends vertically through the lower word line disposed at an uppermost layer among the plurality of lower word lines, an upper surface of the word line separation layer in contact with a lower surface of the upper stack.

17. A semiconductor device comprising:
a substrate including a cell array area and first and second connecting areas disposed at opposite sides of the cell array area, each of the first and second connecting areas including a plurality of through-silicon-via (TSV) areas;
a peripheral circuit structure disposed on the substrate;
a lower stack disposed in the peripheral circuit structure and an upper stack disposed on the lower stack, the lower stack including a plurality of lower insulating layers and a plurality of lower word lines alternately stacked with the lower insulating layers;
a plurality of channel structures extending through the lower stack and the upper stack in the cell array area;
a plurality of dummy channel structures extending through the lower stack and the upper stack in the connecting areas;
a plurality of separation insulating layers extending vertically through the lower stack and the upper stack and extending in a first direction, the separation insulating layers being spaced apart from one another in a second direction crossing the first direction; and
a plurality of word line separation layers disposed at an upper portion of the lower stack and crossing two adjacent separation insulating layers among the plurality of separation insulating layers, the plurality of word line separation layers extending vertically through at least one of the lower word lines,
wherein the plurality of word line separation layers include first word line separation layers arranged into a first column in the first connecting area and second word line separation layers arranged into a second column in the second connecting area, the first word line separation layers and the second word line separation layers are arranged into a zigzag manner in the second direction.

18. The semiconductor device according to claim 17, wherein the plurality of TSV areas are disposed between the separation insulating layers.

19. The semiconductor device according to claim 17, wherein the plurality of separation insulating layers extend throughout the cell array area, the first connecting area and the second connecting area.

20. A semiconductor device comprising:
a substrate including a cell array area and a connecting area, the connecting area including a through-silicon-via (TSV) area;
a peripheral circuit structure disposed on the substrate;
a lower conductive layer disposed on the peripheral circuit structure;
a connecting conductive layer disposed on the lower conductive layer in the cell array area;
a connecting mold layer disposed on the lower conductive layer in the connecting area;
a supporter disposed on the connecting conductive layer and the connecting mold layer;
a buried insulating layer disposed in the TSV area and extending through the lower conductive layer, the connecting mold layer and the supporter;
a lower stack disposed on the supporter, the lower stack including a plurality of lower insulating layers and a plurality of lower word lines alternately stacked with the lower insulating layers;
an upper stack disposed on the lower stack, the upper stack including a plurality of upper insulating layers and a plurality of upper word lines alternately stacked with the upper insulating layers;
a plurality of channel structures extending through the lower stack and the upper stack in the cell array area;
a plurality of dummy channel structures extending through the lower stack and the upper stack in the connecting area;
a pair of separation insulating layers extending vertically through the lower stack and the upper stack and extending in a first horizontal direction, the pair of separation insulating layers being spaced apart from each other in a second horizontal direction crossing the first horizontal direction;
a word line separation layer disposed at an upper portion of the lower stack and crossing the pair of separation insulating layers, the word line separation layer extending vertically through at least one of the lower word lines and extending in the second horizontal direction; and
a TSV disposed in the TSV area, the TSV extending through the upper stack and the lower stack and connected to the peripheral circuit structure, wherein the lower stack further includes a plurality of lower sacrificial layers disposed at the same level as the plurality of lower word lines in the TSV area;
wherein the TSV extends vertically through the plurality of lower sacrificial layers, and
wherein a lower surface of the word line separation layer is disposed at a higher level than a lower surface of the lower stack.

* * * * *